US012787277B2

(12) United States Patent
Wu et al.

(10) Patent No.: US 12,787,277 B2

(45) Date of Patent: Nov. 3, 2026

(54) LEVEL SHIFTER

(71) Applicant: eMemory Technology Inc., Hsin-Chu (TW)

(72) Inventors: Chien-Han Wu, Hsinchu County (TW); Chun-Hung Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 64 days.

(21) Appl. No.: 18/940,874

(22) Filed: Nov. 8, 2024

(65) Prior Publication Data

US 2025/0158616 A1 May 15, 2025

Related U.S. Application Data

(60) Provisional application No. 63/598,558, filed on Nov. 14, 2023.

(51) Int. Cl.

| | |
|---|---|
| ***H10B 41/60*** | (2023.01) |
| ***G11C 16/16*** | (2006.01) |
| ***G11C 16/26*** | (2006.01) |
| ***G11C 16/30*** | (2006.01) |
| ***G11C 16/34*** | (2006.01) |

(Continued)

(52) U.S. Cl.

CPC ............ *H10B 41/60* (2023.02); *G11C 16/16* (2013.01); *G11C 16/26* (2013.01); *G11C 16/30* (2013.01); *G11C 16/3459* (2013.01); *H03K 19/018521* (2013.01); *H10B 41/35* (2023.02);

(Continued)

(58) Field of Classification Search

CPC ....... H03K 19/0175; H03K 19/017509; H03K 19/017518; H03K 19/017527; H03K 19/018; H03K 19/01806; H03K 19/01812; H03K 19/0185; H03K 19/018507; H03K 19/018514; H03K 19/018521; H03K 19/018528; H10B 41/60; H10B 41/35; H10B 41/30; H10D 30/6892; H10D 30/685; H10D 30/683; G11C 16/16; G11C 16/26; G11C 16/30; G11C 16/3459; G11C 5/145; G11C 16/0433; G11C 16/14

See application file for complete search history.

(56) References Cited

U.S. PATENT DOCUMENTS 5,254,887 A * 10/1993 Oguri ............ H03K 19/017518 326/24
7,034,568 B2 * 4/2006 Yamashita ....... H03K 19/09448 326/31

FOREIGN PATENT DOCUMENTS

TW I339501 3/2011

* cited by examiner

*Primary Examiner* — Long Nguyen
(74) *Attorney, Agent, or Firm* — WPAT, PC

(57) ABSTRACT

A level shifter includes a first load circuit, a second load circuit, a BJT transistor, a first MOSFET transistor and a NOT gate. A first terminal of the first load circuit receives the second supply voltage. A first terminal of the second load circuit receives the input signal. A collector of the BJT transistor is connected with a second terminal of the first load circuit. A base of the BJT transistor is connected with a second terminal of the second load circuit. A drain terminal of the first MOSFET transistor is connected with an emitter of the BJT transistor. A source terminal of the first MOSFET transistor receives a ground voltage. A gate terminal of the first MOSFET transistor receives the input signal. An input terminal of the NOT gate is connected with the first load circuit. An output terminal of the NOT gate generates an output signal.

13 Claims, 11 Drawing Sheets

(51) Int. Cl.
*H03K 19/0185* (2006.01)
*H10B 41/35* (2023.01)
*H10D 30/68* (2025.01)
*G11C 5/14* (2006.01)

(52) U.S. Cl.
CPC ....... *H10D 30/685* (2025.01); *H10D 30/6892* (2025.01); *G11C 5/145* (2013.01)

LEVEL SHIFTER

This application claims the benefit of U.S. provisional application Ser. No. 63/598,558, filed Nov. 14, 2023, the subject matters of which is incorporated herein by reference.

FIELD OF THE INVENTION

The present invention relates to a circuit, and more particularly to a level shifter.

BACKGROUND OF THE INVENTION

Generally, an integrated circuit (IC) has different power domains. The circuits in different power domains receive different supply voltages. For example, the supply voltage of the $V_{DD1}$ power domain is $V_{DD1}$, and the supply voltage of the $V_{DD2}$ power domain is $V_{DD2}$. The supply voltage $V_{DD1}$ and the supply voltage $V_{DD2}$ are different. For example, the supply voltage $V_{DD1}$ is 1.2V, and the supply voltage $V_{DD2}$ is 5V.

Nowadays, the CMOS semiconductor manufacturing process is selected according to the operating voltage range of the semiconductor device. For example, the CMOS manufacturing process for a medium voltage device (also referred as a MV device) is used to fabricate a transistor that withstands higher voltage stress, and this transistor is suitable for the medium voltage operation. In addition, the CMOS manufacturing process for a low voltage device (also referred as a LV device) is used to fabricate a transistor that has fast computing speed and withstands lower voltage stress, and this transistor is suitable for the low voltage operation. For example, in the medium voltage operation, the voltage stress that can be withstood by the region between the gate terminal and the source terminal of the transistor is in the range between 3.0V and 10V. Moreover, in the low voltage operation, the voltage stress that can be withstood by the region between the gate terminal and the source terminal of the transistor is in the range between 0.8V and 2.0V.

FIG. 1A is a schematic circuit diagram illustrating the operations of the circuits between different power domains in an IC chip. In the $V_{DD1}$ power domain of the IC chip 100, the logic high level of the signal operated by a first circuit 102 is the supply voltage $V_{DD1}$, and the logic low level is a ground voltage GND. In the $V_{DD2}$ power domain of the IC chip 100, the logic high level of the signal operated by a second circuit 106 is the supply voltage $V_{DD2}$, and the logic low level is the ground voltage GND.

Furthermore, a level shifter 104 is used to convert logic levels of the signals between different power domains. Consequently, the circuits in different power domains can communicate with each other normally. Generally, the main circuit of the level shifter 104 is included in the $V_{DD2}$ power domain, and only few circuits (not shown) are included in the $V_{DD1}$ power domain.

For example, the first circuit 102 uses a control signal $C_{TRL1}$ to communicate with the second circuit 106. Meanwhile, the level shifter 104 receives the control signal $C_{TRL1}$ from the first circuit 102 as an input signal IN of the level shifter 104. In addition, an output signal OUT generated by the level shifter 104 is served as another control signal $C_{TRLA}$. The control signal $C_{TRLA}$ is transmitted to the second circuit 106. That is, the control signal $C_{TRL1}$ with the logic high level (i.e., $V_{DD1}$) in the $V_{DD1}$ power domain is converted into the control signal $C_{TRLA}$ with the logic high level (i.e., $V_{DD2}$) in the $V_{DD2}$ power domain by the level shifter 104. In addition, the control signal $C_{TRL1}$ with the logic low level (i.e., GND) in the $V_{DD1}$ power domain is converted into the control signal $C_{TRLA}$ with the logic low level (i.e., GND) in the $V_{DD2}$ power domain by the level shifter 104. Consequently, the two circuits 102 and 106 can communicate with each other normally.

In case that the first circuit 102 uses more control signals to communicate with the second circuit 106, more level shifters are needed. For example, if the first circuit 102 uses ten control signals to communicate with the second circuit 106, ten level shifters are needed to convert the logic levels of the ten control signals.

FIG. 1B is a schematic circuit diagram of a conventional level shifter. By the level shifter 110, an input signal IN and an inverted input signal ZIN in the range between the supply voltage $V_{DD1}$ and the ground voltage GND are converted into an output signal OUT in the range between the supply voltage $V_{DD2}$ and the ground voltage GND. For example, the supply voltage $V_{DD1}$ is 1.2V, the supply voltage $V_{DD2}$ is 5V, and the ground voltage GND is 0V. That is, the supply voltage $V_{DD2}$ is higher than the supply voltage $V_{DD1}$, and the supply voltage $V_{DD1}$ is higher than the ground voltage GND.

As shown in FIG. 1B, the level shifter 110 comprises a NOT gate 116, a cross-coupled circuit 112 and a differential pair circuit 114. The NOT gate 116 is included in the $V_{DD1}$ power domain, and the cross-coupled circuit 112 and the differential pair circuit 114 are included in the $V_{DD2}$ power domain. The cross-coupled circuit 112 comprises a P-type transistor MP1 and a P-type transistor MP2. The differential pair circuit 114 comprises an N-type transistor MN1 and an N-type transistor MN2. The P-type transistor MP1, the P-type transistor MP2, the N-type transistor MN1 and the N-type transistor MN2 are all MOSFET transistors (Metal-Oxide-Semiconductor Field-Effect Transistor).

The two power terminals of the NOT gate 116 are respectively connected with the supply voltage $V_{DD1}$ and the ground voltage GND. The input terminal of the NOT gate 116 receives the input signal IN. The output terminal of the NOT gate 116 generates the inverted input signal ZIN.

The cross-coupled circuit 112 is connected with the supply voltage $V_{DD2}$, the node a and the node b. The source terminal of the P-type transistor MP1 is connected with the supply voltage $V_{DD2}$. The drain terminal of the P-type transistor MP1 is connected with the node a. The gate terminal of the P-type transistor MP1 is connected with the node b. The source terminal of P-type transistor MP2 is connected with the supply voltage $V_{DD2}$. The drain terminal of P-type transistor MP2 is connected with the node b. The gate terminal of P-type transistor MP2 is connected with the node a. The voltage at the node b is the output signal OUT.

The differential pair circuit 114 is connected with the ground voltage GND, the node a and the node b. The drain terminal of the N-type transistor MN1 is connected with the node a. The source terminal of the N-type transistor MN1 is connected with the ground voltage GND. The gate terminal of the N-type transistor MN1 receives the input signal IN. The drain terminal of the N-type transistor MN2 is connected with the node b. The source terminal of the N-type transistor MN2 is connected with the ground voltage GND. The gate terminal of the N-type transistor MN2 receives the inverted input signal ZIN.

In case that the input signal IN of the level shifter 110 is the supply voltage $V_{DD1}$ (i.e., the logic high level) and the inverted input signal ZIN is the ground voltage GND (i.e., the logic low level), the N-type transistor MN1 and the P-type transistor MP2 are turned on, and the N-type transistor MN2 and P-type transistor MP1 are turned off. Consequently, the voltage at the node b is the supply voltage $V_{DD2}$, and the output signal OUT is the supply voltage $V_{DD2}$ (i.e., the logic high level). In other words, the supply voltage $V_{DD1}$ with the logic high level is converted into the supply voltage $V_{DD2}$ with another logic high level by the level shifter 110.

In case that the input signal IN of the level shifter 110 is the ground voltage GND (i.e., the logic low level) and the inverted input signal ZIN is the supply voltage $V_{DD1}$ (i.e., the logic high level), the N-type transistor MN1 and the P-type transistor MP2 are turned off, and the N-type transistor MN2 and P-type transistor MP1 are turned on. Consequently, the voltage at the node b is the ground voltage GND, and the output signal OUT is the ground voltage GND. In other words, the ground voltage GND with the logic low level is converted into the same ground voltage GND with the logic low level by the level shifter 110.

As mentioned above, the maximum voltage stress that can be withstood by each of the four transistors MP1, MP2, MN1, and MN2 in the level shifter 110 of FIG. 1B is approximately equal to the supply voltage $V_{DD2}$. That is, the four transistors MP1, MP2, MN1, and MN2 in the conventional level shifter 110 must be medium voltage devices (MV devices). Generally, the threshold voltage of each of the N-type transistors MN1 and MN2 produced by using the manufacturing process for the MV devices is very close to the supply voltage $V_{DD1}$. In other words, when the gate terminal of the N-type transistor MN1 or N-type transistor MN2 in the differential pair circuit 114 receives the supply voltage $V_{DD1}$, the N-type transistor MN1 or N-type transistor MN2 cannot be turned on completely. Since the driving capability of MN1 or N-type transistor MN2 is insufficient, the operating speed of the level shifter 110 cannot be increased.

In order to solve the defects of the level shifter 110 in FIG. 1B, the N-type transistor MN1 and N-type transistor MN2 in the differential pair circuit 114 may be modified as the LV device. Furthermore, since the LV device cannot withstand the high voltage stress, the differential pair circuit needs to be further modified.

FIG. 1C is a schematic circuit diagram of another conventional level shifter. As shown in FIG. 1C, the level shifter 120 comprises a NOT gate 116, a cross-coupled circuit 112 and a differential pair circuit 134. The circuitry structures of the NOT gate 116 and the cross-coupled circuit 112 in the level shifter of FIG. 1C are similar to those of the level shifter of FIG. 1B, and not redundantly described herein. For brevity, only the circuitry structure of the differential pair circuit 134 will be described as follows.

The differential pair circuit 134 is connected with the ground voltage GND, the node a and the node b. The differential pair circuit 134 comprises an N-type transistor MN1, an N-type transistor MN2, an N-type transistor MN3 and an N-type transistor MN4. The N-type transistor MN1 and the N-type transistor MN2 are LV devices. The N-type transistors MN3 and the N-type transistors MN4 are MV devices. The N-type transistor MN3 and the N-type transistor MN4 are native transistors, which are also referred as depletion-mode transistors. The native transistor is a transistor with initial conductive characteristics (i.e., already-on characteristics). The threshold voltage Vt of each of the N-type transistor MN3 and the N-type transistor MN4 is very low, e.g., approximately in the range between −0.3V and +0.3V.

The drain terminal of the N-type transistor MN3 is connected with node a. The gate terminal of the N-type transistor MN3 receives the input signal IN. The drain terminal of the N-type transistor MN4 is connected with node b. The gate terminal of the N-type transistor MN4 receives the inverted input signal ZIN. The drain terminal of the N-type transistor MN1 is connected with the source terminal of the N-type transistor MN3. The source terminal of the N-type transistor MN1 is connected with the ground voltage GND. The gate terminal of the N-type transistor MN1 receives the input signal. IN. The drain terminal of the N-type transistor MN2 is connected with the source terminal of the N-type transistor MN4. The source terminal of the N-type transistor MN2 is connected with the ground voltage GND. The gate terminal of the N-type transistor MN2 receives the inverted input signal ZIN.

The operations of the level shifter 120 shown in FIG. 1C are similar to those of the level shifter 110 shown in FIG. 1B, and not redundantly described herein. Since the N-type transistor MN3 and the N-type transistor MN4 are MV devices, they can withstand higher voltage stress and share the voltage stress of the N-type transistor MN1 and the N-type transistor MN2. Consequently, the N-type transistor MN1 and the N-type transistor MN2 (i.e., LV devices) can bear lower voltage stress, and they can be operated normally.

Since the N-type transistor MN1 and the N-type transistor MN2 are LV devices, their threshold voltages Vt are very low, e.g., about a half of the supply voltage $V_{DD1}$. When the gate terminal of the N-type transistor MN1 or the N-type transistor MN2 receives the supply voltage $V_{DD1}$, the N-type transistor MN1 or the N-type transistor MN2 can be turned on completely. Consequently, the level shifter 120 can be operated normally.

However, most of today's CMOS semiconductor manufacturing processes cannot support the production processes of native transistors, and special processes and additional cost are needed to manufacture the native transistors. Especially, the CMOS semiconductor manufacturing process including a deep N-well process (DNW process) cannot support the production of native transistors. In other words, the level shifter 120 shown in FIG. 1C is not suitably included in most of the today's IC chips.

FIG. 2A is a schematic circuit diagram of another conventional level shifter. The level shifter 150 does not include a native transistor. In addition, the manufacturing process of the level shifter 150 is compatible with the CMOS semiconductor manufacturing process. The level shifter 150 comprises a NOT gate 116, a cross-coupled circuit 112 and a differential pair circuit 154. The circuitry structures of the NOT gate 116 and the cross-coupled circuit 112 in the level shifter of FIG. 2A are similar to those of the level shifter of FIG. 1B, and not redundantly described herein. For brevity, only the circuitry structure of the differential pair circuit 154 will be described as follows.

The differential pair circuit 154 is connected with the ground voltage GND, the node a and the node b. The differential pair circuit 154 comprises an N-type transistor MN1, an N-type transistor MN2, an N-type transistor MN3 and an N-type transistor MN4. The N-type transistor MN1 and the N-type transistor MN2 are LV devices. The N-type transistors MN3 and the N-type transistors MN4 are MV devices.

The drain terminal of the N-type transistor MN3 is connected with the node a. The gate terminal of the N-type transistor MN3 receives a bias voltage Vbias. The drain terminal of the N-type transistor MN4 is connected with the node b. The gate terminal of the N-type transistor MN4 receives the bias voltage Vbias. The drain terminal of the N-type transistor MN1 is connected with the source terminal of the N-type transistor MN3. The source terminal of the N-type transistor MN1 is connected with the ground voltage GND. The gate terminal of the N-type transistor MN1 receives the input signal IN. The drain terminal of the N-type transistor MN2 is connected with the source terminal of the N-type transistor MN4. The source terminal of the N-type transistor MN2 is connected with the ground voltage GND. The gate terminal of the N-type transistor MN2 receives the inverted input signal ZIN. The bias voltage Vbias is lower than the supply voltage $V_{DD2}$, and the bias voltage Vbias is higher than the supply voltage $V_{DD1}$. In response to the bias voltage Vbias, the N-type transistor MN3 and the P-type transistor MN4 are maintained in a conducting state.

The operations of the level shifter 150 shown in FIG. 2A are similar to those of the level shifters 110 and 129 shown in FIGS. 1B and 1C, and not redundantly described herein. Since the N-type transistor MN3 and the N-type transistor MN4 are MV devices, they can withstand higher voltage stress and share the voltage stress of the N-type transistor MN1 and the N-type transistor MN2. Consequently, the N-type transistor MN1 and the N-type transistor MN2 (i.e., LV devices) can bear lower voltage stress, and they can be operated normally.

However, since the level shifter 150 needs to additionally receive the bias voltage Vbias, it is necessary to design an additional bias voltage generator in the IC chip to provide the bias voltage Vbias to the level shifter 150.

FIG. 2B is a schematic circuit diagram illustrating the operations of the circuits between different power domains in an IC chip with the level shifter shown in FIG. 2A. In the $V_{DD1}$ power domain of the IC chip 200, the logic high level of the signal operated by a first circuit 202 is the supply voltage $V_{DD1}$, and the logic low level is a ground voltage GND. In the $V_{DD2}$ power domain of the IC chip 200, the logic high level of the signal operated by a second circuit 206 is the supply voltage $V_{DD2}$, and the logic low level is the ground voltage GND. Furthermore, the level shifter 150 is used to convert logic levels of the signals between different power domains. The level shifter 150 has the circuitry structure shown in FIG. 2A.

The level shifter 150 needs to additionally receive the bias voltage Vbias. The bias voltage Vbias is in the range between the supply voltage $V_{DD2}$ and the supply voltage $V_{DD1}$. The bias voltage generator 208 is included in the $V_{DD2}$ power domain. That is, the bias voltage generator 208 receives the supply voltage $V_{DD2}$ and generates the bias voltage Vbias to the level shifter 150. After the bias voltage generator 208 generates the bias voltage Vbias to the level shifter 150, the level shifter 150 can be operated normally.

For example, the first circuit 202 uses a control signal $C_{TRL1}$ to communicate with the second circuit 206. Meanwhile, the level shifter 150 receives the control signal $C_{TRL1}$ from the first circuit 202 as the input signal IN of the level shifter 150. In addition, an output signal OUT generated by the level shifter 150 is served as another control signal $C_{TRLA}$. The control signal $C_{TRLA}$ is transmitted to the second circuit 206.

However, in the IC chip 200 of FIG. 2B, the bias voltage generator 208 needs to be continuously operated to provide the bias voltage Vbias to the level shifter 150. When the first circuit 202 is in a standby state or disabled, the bias voltage generator 208 is continuously operated to provide the bias voltage Vbias. Consequently, the IC chip 200 consumes additional energy.

In order to solve the above problems, the first circuit 202 of the $V_{DD1}$ power domain can send an enable signal EN to the bias voltage generator 208 to control the bias voltage generator 208. When the first circuit 202 is in the standby state or disabled, the bias voltage generator 208 does not generate the bias voltage Vbias. When the first circuit 202 is enabled, the enable signal EN is activated, and the bias voltage generator 208 generates the bias voltage Vbias. When the level shifter 150 receives the bias voltage Vbias and is operated normally, the first circuit 202 uses the control signal $C_{TRL1}$ to communicate with the second circuit 206. That is, the first circuit 202 uses the above method to control the bias voltage generator 208 in order to prevent the bias voltage generator 208 from consuming additional energy.

However, since the first circuit 202 is included in the $V_{DD1}$ power domain and the bias voltage generator 208 is included in the $V_{DD2}$ power domain, the logic level of the $V_{DD1}$ power domain is different from the logic level of the $V_{DD2}$ power domain. That is, the enable signal EN from the first circuit 202 cannot be directly used to control the bias voltage generator 208.

In order to enable the communication between the first circuit 202 and the bias voltage generator 208, the IC chip 200 of FIG. 2B needs to be further modified. FIG. 3 is a schematic circuit diagram illustrating the operations of the circuits between different power domains in another IC chip. In the $V_{DD2}$ power domain of the IC chip 300, another level shifter 350 is provided. By the level shifter 350, the enable signal EN from the first circuit 202 is converted into another enable signal $EN_A$. According to the enable signal $EN_A$, the bias voltage generator 208 can be operated normally.

In the IC chip 300 of FIG. 3, the bias voltage generator 208 needs to generate the bias voltage Vbias according to the enable signal $EN_A$. Moreover, for outputting the enable signal $EN_A$, the level shifter 350 needs to receive the bias voltage Vbias.

However, when the enable signal EN is activated by the first circuit 202, the level shifter 350 has not yet received the bias voltage Vbias, and the level shifter 350 is unable to generate the control signal $EN_A$ to the bias voltage generator 208. In other words, the level shifter 350 and the bias voltage generator 208 in the IC chip 300 cannot be operated normally. Of course, since the level shifter 150 cannot be operated, the first circuit 202 cannot use the control signal $C_{TRL1}$ to communicate with the second circuit 206.

SUMMARY OF THE INVENTION

An embodiment of the present invention provides a level shifter for converting an input signal between a first supply voltage and a ground voltage into an output signal between a second supply voltage and the ground voltage. The level shifter includes a first load circuit, a second load circuit, a BJT transistor, a first MOSFET transistor and a NOT gate. A first terminal of the first load circuit receives the second supply voltage. A first terminal of the second load circuit receives the input signal. A collector of the BJT transistor is connected with a second terminal of the first load circuit. A base of the BJT transistor is connected with a second terminal of the second load circuit. A drain terminal of the first MOSFET transistor is connected with an emitter of the BJT transistor. A source terminal of the first MOSFET transistor receives the ground voltage. A gate terminal of the first MOSFET transistor receives the input signal. A first power terminal of the NOT gate receives the second supply voltage. A second power terminal of the NOT gate receives the ground voltage. An input terminal of the NOT gate is connected with the first load circuit. An output terminal of the NOT gate generates the output signal.

Another embodiment of the present invention provides a level shifter for converting an input signal between a first supply voltage and a ground voltage into an output signal between a second supply voltage and the ground voltage. The level shifter includes a first load circuit, a second load circuit, y BJT transistors, z MOSFET transistors and a NOT gate. A first terminal of the first load circuit receives the second supply voltage. A first terminal of the second load circuit receives the input signal. The bases of the y BJT transistors are connected with the second load circuit, and y is an integer greater than or equal to 1. In the y BJT transistors, a collector of a first BJT transistor is connected with a second terminal of the first load circuit, an emitter of a y-th BJT transistor is connected with a first node, a collector of each of the other BJT transistors is connected with an emitter of a previous BJT transistor, and an emitter of each of the other BJT transistors is connected with a collector of a next BJT transistor. The gate terminals of the z MOSFET transistors receive the input signal, z is an integer greater than or equal to 1. If one of y and z is 1, the other of y and z is not 1. In the z MOSFET transistors, a drain terminal of a first MOSFET transistor is connected with the first node, a source terminal of a z-th MOSFET transistor receives the ground voltage, a drain terminal of each of the other MOSFET transistors is connected with a source terminal of a previous MOSFET transistor, and a source terminal of each of the other MOSFET transistor is connected with a drain terminal of a next MOSFET transistor. A first power terminal of the NOT gate receives the second supply voltage. A second power terminal of the NOT gate receives the ground voltage. An input terminal of the NOT gate is connected with the first load circuit. An output terminal of the NOT gate generates the output signal.

Another embodiment of the present invention provides a level shifter for converting an input signal and an inverted input voltage between a first supply voltage and a ground voltage into an output signal between a second supply voltage and the ground voltage. The level shifter includes a first load circuit, a second load circuit, a third load circuit, a first BJT transistor, a second BJT transistor, a first MOSFET transistor and a second MOSFET transistor. The first load circuit is connected with the second supply voltage, a first node and a second node. A voltage at the second node is the output signal. A first terminal of the second load circuit receives the input signal. A first terminal of the third load circuit receives the inverted input signal. A collector of the first BJT transistor is connected with the first node. A base of the first BJT transistor is connected with a second terminal of the second load circuit. A collector of the second BJT transistor is connected with the second node. A base of the second BJT transistor is connected with a second terminal of the third load circuit. A drain terminal of the first MOSFET transistor is connected with an emitter of the first BJT transistor. A source terminal of the first MOSFET transistor receives the ground voltage. A gate terminal of the first MOSFET transistor receives the input signal. A drain terminal of the second MOSFET transistor is connected with an emitter of the second BJT transistor. A source terminal of the second MOSFET transistor receives the ground voltage. A gate terminal of the second MOSFET transistor receives the inverted input signal.

Another embodiment of the present invention provides a level shifter for converting an input signal and an inverted input voltage between a first supply voltage and a ground voltage into an output signal between a second supply voltage and the ground voltage. The level shifter includes a first load circuit, a second load circuit, a third load circuit, a first group of y BJT transistors, a second group of y BJT transistors, a third group of z MOSFET transistors and a fourth group of z MOSFET transistors. The first load circuit is connected with the second supply voltage, a first node and a second node. A voltage at the second node is the output signal. A first terminal of the second load circuit receives the input signal. A first terminal of the third load circuit receives the inverted input signal. The bases of the first group of y BJT transistors are connected with the second load circuit, and y is an integer greater than or equal to 1. In the first group of y BJT transistors, a collector of a first BJT transistor is connected with the first node, an emitter of a y-th BJT transistor is connected with a third node, a collector of each of the other BJT transistors is connected with an emitter of a previous BJT transistor, and an emitter of each of the other BJT transistors is connected with a collector of a next BJT transistor. The bases of the second group of y BJT transistors are connected with the third load circuit. In the second group of y BJT transistors, a collector of a first BJT transistor is connected with the second node, an emitter of a y-th BJT transistor is connected with a fourth node, a collector of each of the other BJT transistors is connected with an emitter of a previous BJT transistor, and an emitter of each of the other BJT transistors is connected with a collector of a next BJT transistor. The gate terminals of the third group of z MOSFET transistors receive the input signal, z is an integer greater than or equal to 1. If one of y and z is 1, the other of y and z is not 1. In the third group of z MOSFET transistors, a drain terminal of a first MOSFET transistor is connected with the third node, a source terminal of a z-th MOSFET transistor receives the ground voltage, a drain terminal of each of the other MOSFET transistors is connected with a source terminal of a previous MOSFET transistor, and a source terminal of each of the other MOSFET transistor is connected with a drain terminal of a next MOSFET transistor. The gate terminals of the fourth group of z MOSFET transistors receive the inverted input signal. In the fourth group of z MOSFET transistors, a drain terminal of a first MOSFET transistor is connected with the fourth node, a source terminal of a z-th MOSFET transistor receives the ground voltage, a drain terminal of each of the other MOSFET transistors is connected with a source terminal of a previous MOSFET transistor, and a source terminal of each of the other MOSFET transistor is connected with a drain terminal of a next MOSFET transistor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
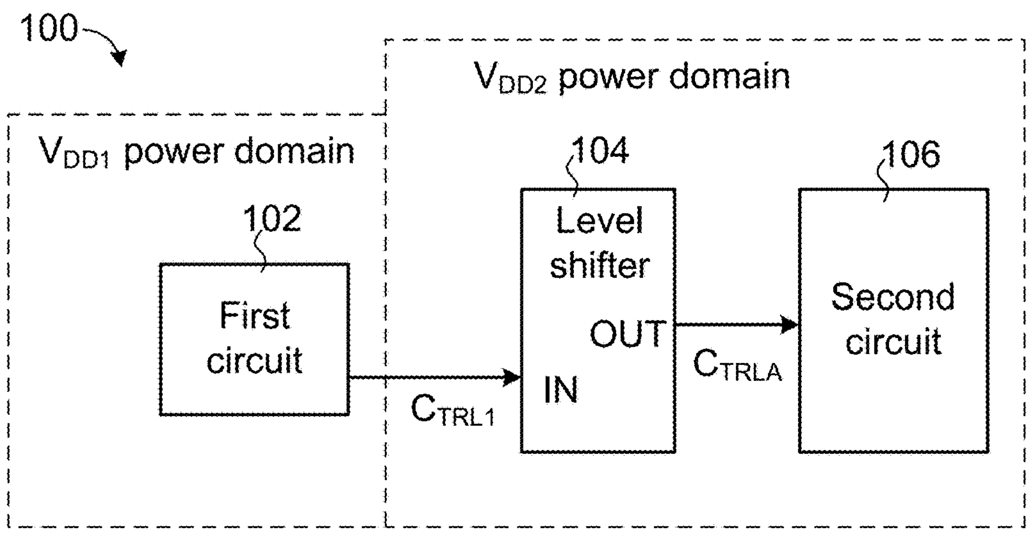
FIG. 1A (PRIOR ART)
FIG. 1A (prior art) is a schematic circuit diagram illustrating the operations of the circuits between different power domains in an IC chip.
Figure 1B:
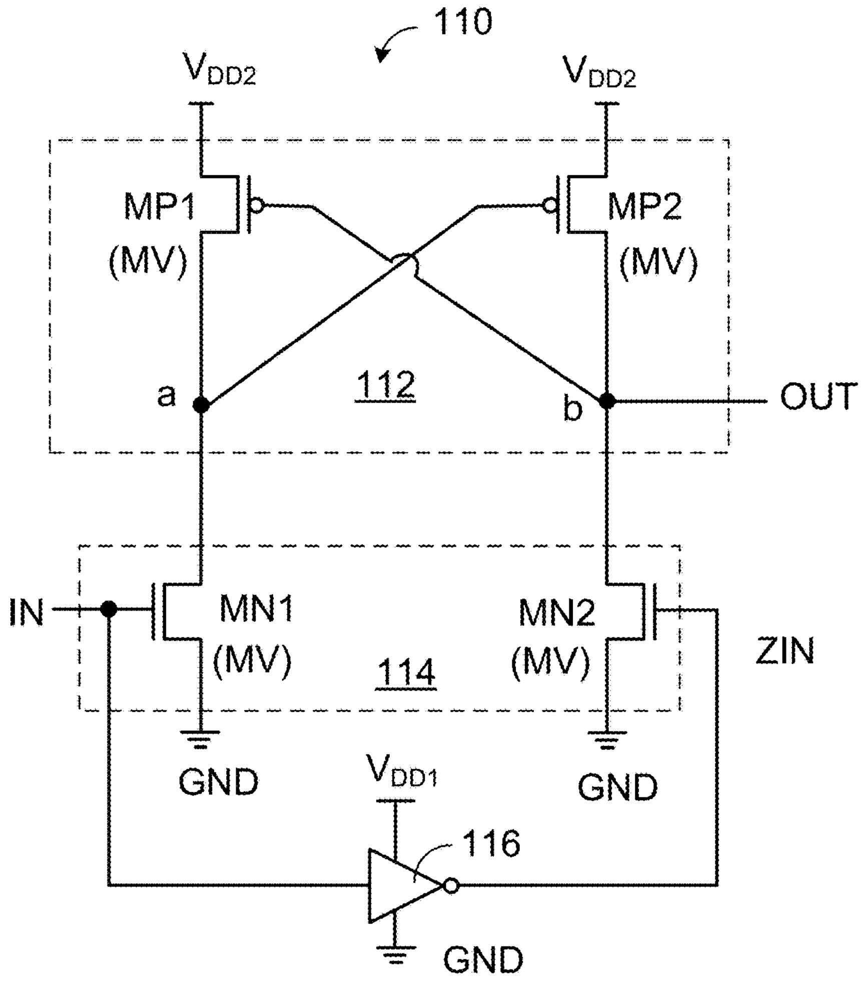
FIG. 1B (PRIOR ART)
FIG. 1B (prior art) is a schematic circuit diagram of a conventional level shifter.
Figure 2A:
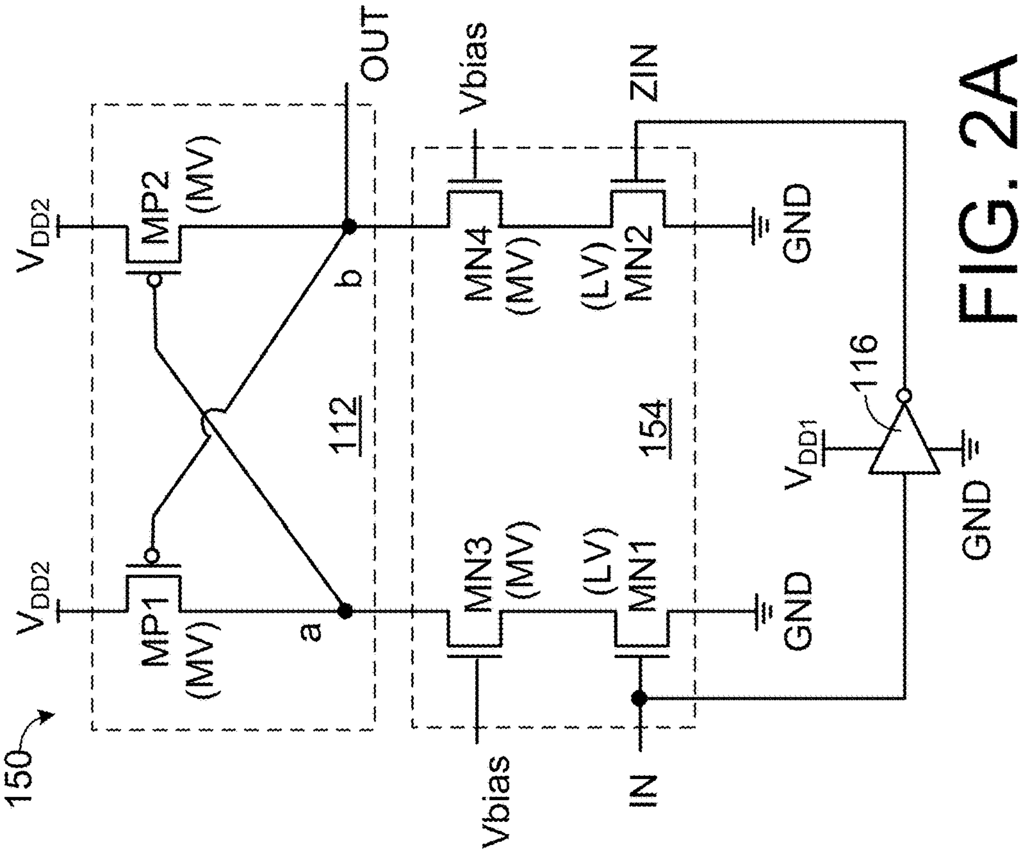
FIG. 2A (PRIOR ART)
FIG. 2A (prior art) is a schematic circuit diagram of another conventional level shifter.
Figure 1C:
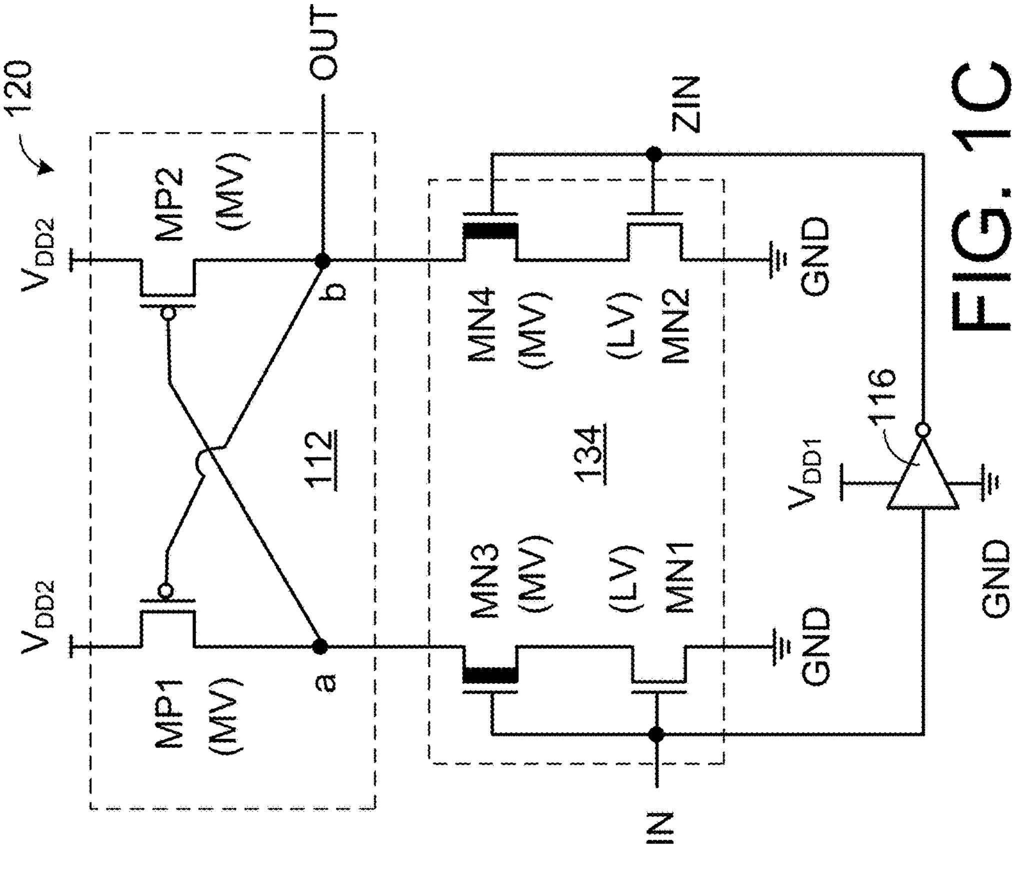
FIG. 1C (PRIOR ART)
FIG. 1C (prior art) is a schematic circuit diagram of another conventional level shifter.
Figure 2B:
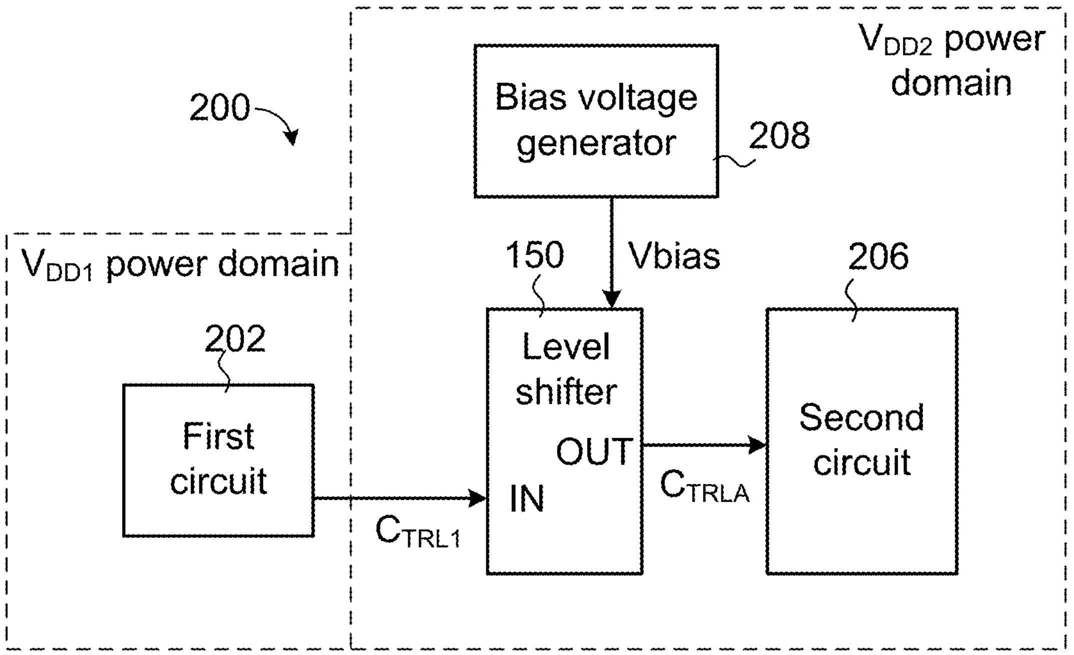
FIG. 2B (PRIOR ART)
FIG. 2B (prior art) is a schematic circuit diagram illustrating the operations of the circuits between different power domains in an IC chip with the level shifter shown in FIG. 2A.
Figure 3:
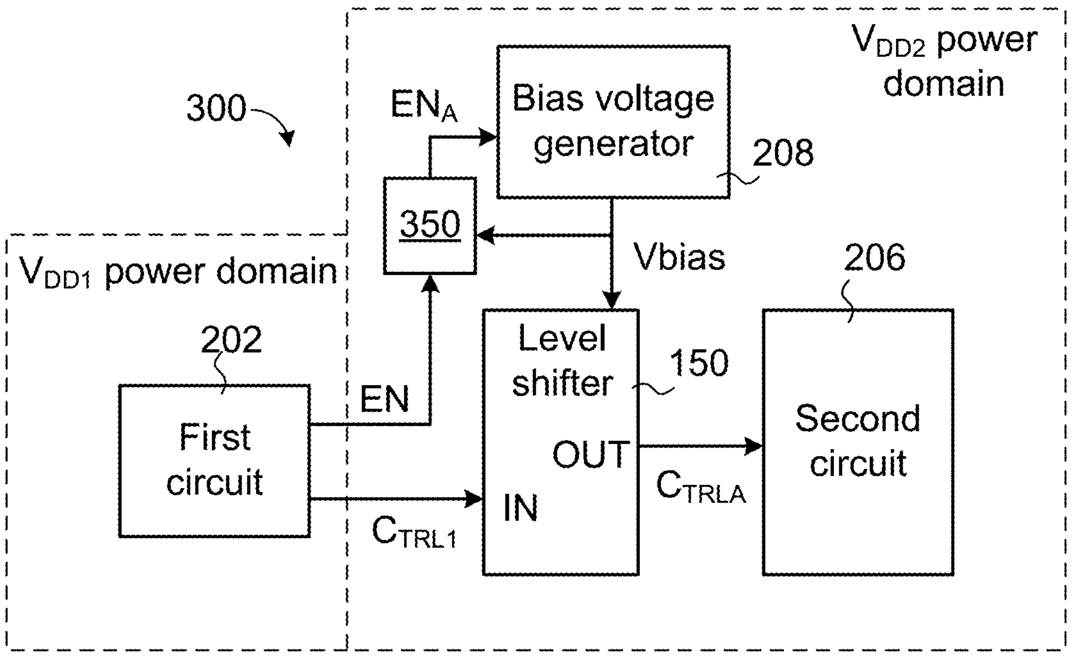
FIG. 3 (PRIOR ART)
FIG. 3 (prior art) is a schematic circuit diagram illustrating the operations of the circuits between different power domains in another IC chip.

The present invention provides a level shifter. The manufacturing process of the level shifter is compatible with the existing CMOS manufacturing process and does not require the use of an additional special manufacturing process. Furthermore, the level shifter can be operated normally without the need of receiving the bias voltage Vbias. That is, the level shifter of the present invention can be applied to the level shifter 350 in FIG. 3. It is noted that the applications of the level shifter of the present invention are not restricted. For example, the level shifter of the present invention can also be applied to the level shifter 104 in FIG. 1A. The level shifter of the present invention includes a single-ended-type level shifter and a differential-type level shifter. The associated circuitry structures and operations of the single-ended-type level shifter and the differential-type level shifter will be described as follows.

Figure 4A:
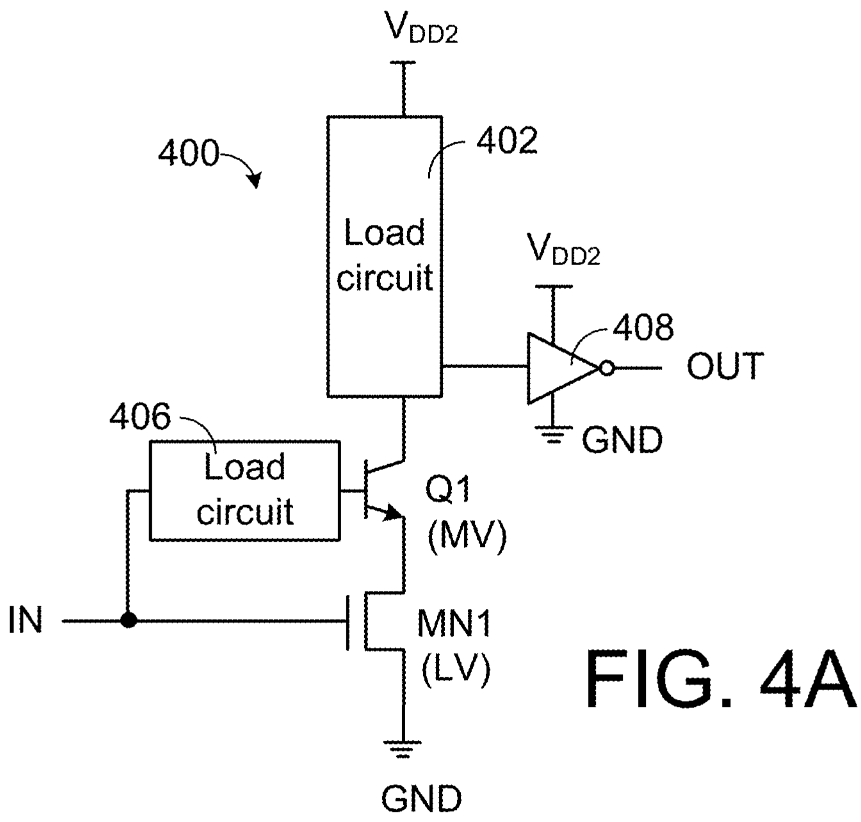
FIG. 4A is a schematic circuit diagram of a single-ended-type level shifter according to a first embodiment of the present invention.

FIG. 4A is a schematic circuit diagram of a single-ended-type level shifter according to a first embodiment of the present invention. The level shifter 400 is included in the $V_{DD2}$ power domain. The level shifter 400 comprises a NOT gate 408, a BJT transistor (Bipolar Junction Transistor) Q1, a MOSFET transistor MN1, and two load circuits 402 and 406. The BJT transistor Q1 is an NPN transistor. In addition, the BJT transistor Q1 is a MV device. The MOSFET transistor MN1 is an N-type transistor. In addition, the MOSFET transistor MN1 is a LV device.

The first terminal of the first load circuit 402 is connected with the supply voltage $V_{DD2}$. The second terminal of the first load circuit 402 is connected with the collector of the BJT transistor Q1. The two power terminals of the NOT gate 408 are respectively connected with the supply voltage $V_{DD2}$ and the ground voltage GND. The input terminal of the NOT gate 408 is connected with the first load circuit 402. The output terminal of the NOT gate 408 generates the output signal OUT. The first terminal of the second load circuit 406 receives the input signal IN. The second terminal of the second load circuit 406 is connected with the base of the BJT transistor Q1. The emitter of the BJT transistor Q1 is connected with the drain terminal of the MOSFET transistor MN1. The source terminal of the MOSFET transistor MN1 is connected with the ground voltage GND. The gate terminal of the MOSFET transistor MN1 receives the input signal IN.

Since the MOSFET transistor MN1 is a LV device, its threshold voltage Vt is very low. In addition, the turn on voltage of the BJT transistor Q1 is about 0.7V. That is, in response to the logic high level of the supply voltage $V_{DD1}$, the MOSFET transistor MN1 and the BJT transistor Q1 can be turned on easily. For example, the supply voltage $V_{DD1}$ is 1.2V, and the supply voltage $V_{DD2}$ is 5V.

Figure 4B:
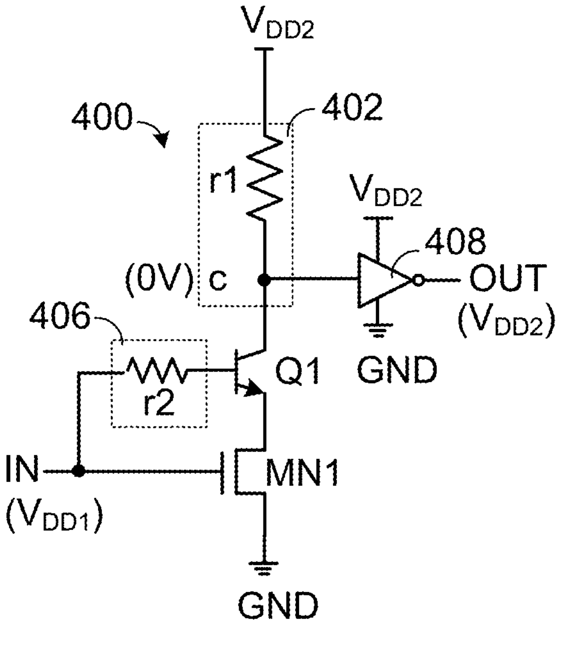
FIGS. 4B and 4C is a schematic circuit diagram illustrating the operations of the single-ended-type level shifter shown in FIG. 4A.
Figure 4C:
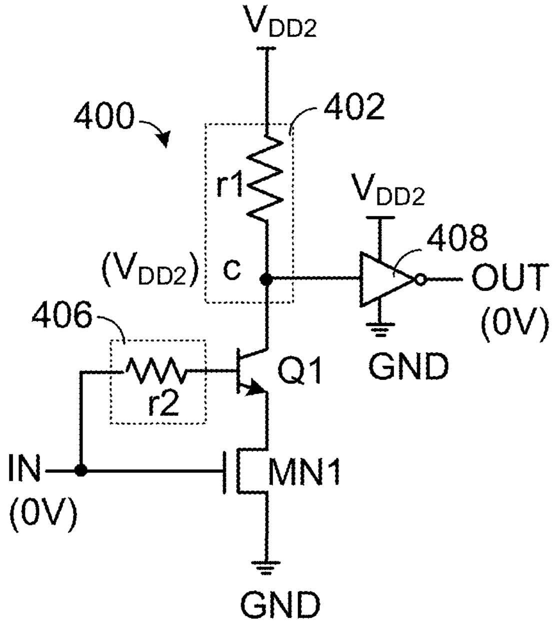

In an embodiment, the load circuits 402 and 406 are resistors, e.g., polysilicon resistors. Hereinafter, the operations of the level shifter 400 will be illustrated with reference to FIGS. 4B and 4C. The first load circuit 402 comprises a resistor r1. The second load circuit 406 comprises a resistor r2. FIGS. 4B and 4C is a schematic circuit diagram illustrating the operations of the single-ended-type level shifter shown in FIG. 4A. In the first load circuit 402, the first terminal of the resistor r1 is connected with the supply voltage $V_{DD2}$, and the second terminal of the resistor r1 is connected with the node c. The collector of the BJT transistor Q1 is connected with the node c. The input terminal of the NOT gate 408 is connected with node c. In the second load circuit 406, the first terminal of the resistor r2 receives the input signal IN, and the second terminal of the resistor r2 is connected with the base of the BJT transistor Q1.

Please refer to FIG. 4B. In case that the input signal IN of the level shifter 400 is the supply voltage $V_{DD1}$ (i.e., the logic high level), the MOSFET transistor MN1 and the BJT transistor Q1 are turned on, and the voltage at the node c is the ground voltage GND (0V). Consequently, the output signal OUT from the NOT gate 408 is the supply voltage $V_{DD2}$ (i.e., the logic high level). In other words, the supply voltage $V_{DD1}$ with the logic high level is converted into the supply voltage $V_{DD2}$ with another logic high level by the level shifter 400.

Please refer to FIG. 4C. In case that the input signal IN of the level shifter 400 is the ground voltage GND (i.e., the logic low level), the MOSFET transistor MN1 and the BJT transistor Q1 are turned off, and the voltage at the node c is the supply voltage $V_{DD2}$. Consequently, the output signal OUT from the NOT gate 408 is the ground voltage GND (i.e., the logic low level). In other words, the ground voltage GND (0V) with the logic low level is converted into the same ground voltage GND (0V) with the logic low level by the level shifter 400.

Obviously, in case that the input signal IN of the level shifter 400 is the ground voltage GND (i.e., the logic low level), the MOSFET transistor MN1 and the BJT transistor Q1 are turned off. Under this circumstance, the level shifter 400 does not generate any DC current, and thus the power consumption is effectively reduced.

In the level shifter 400 of the first embodiment, the load circuits 402 and 406 are implemented with polysilicon resistors. The resistance value of the resistor r2 in the second load circuit 406 is related to the base current of the BJT transistor Q1. For example, the greater the resistance value of resistor r2, the smaller the base current of the BJT transistor Q1. Consequently, in case that the magnitude of the base current is not taken into the consideration, the second load circuit 406 may be omitted. In other words, the resistance value of the resistor r2 in the second load circuit 406 only needs to be greater than or equal to zero. If the resistance value of the resistor r2 in the second load circuit 406 is equal to zero, it means that the base of the BJT transistor Q1 directly receives the input signal IN.

Figure 4E:
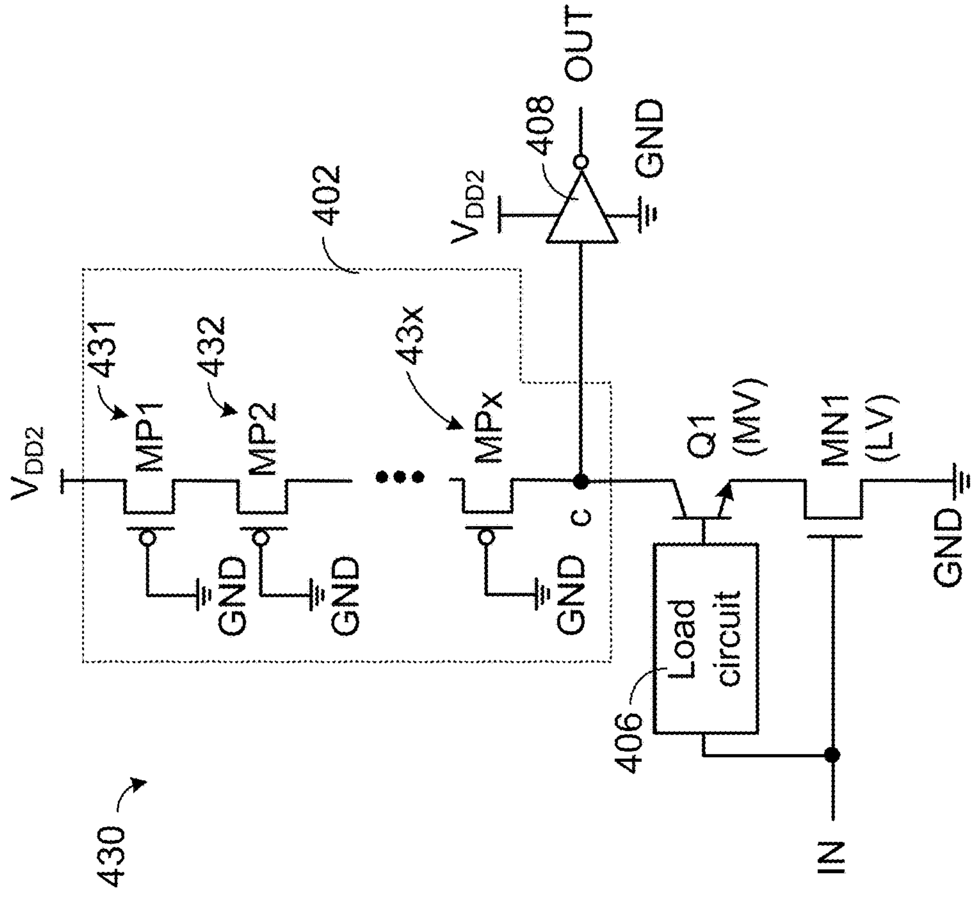
FIG. 4E is a schematic circuit diagram of a single-ended-type level shifter according to a third embodiment of the present invention.
Figure 4D:
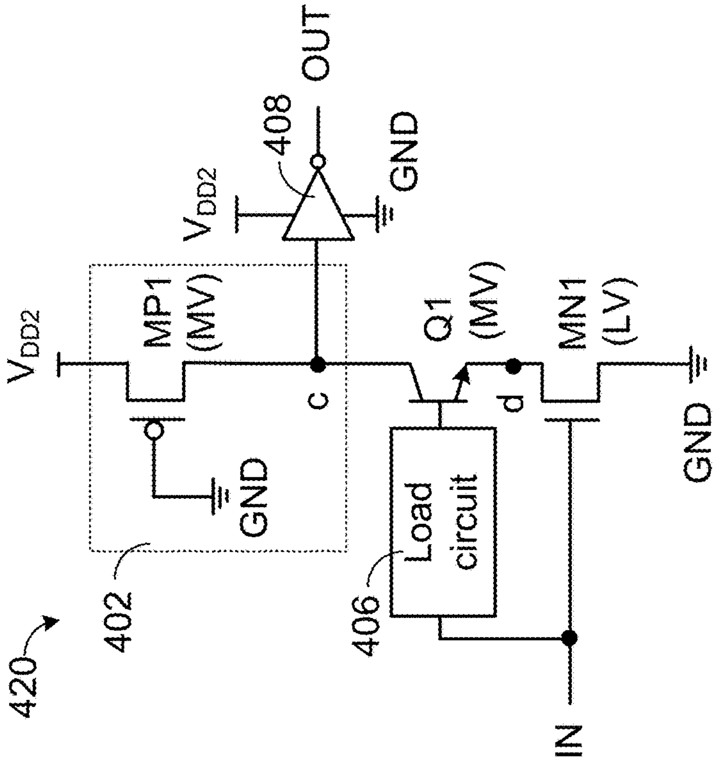
FIG. 4D is a schematic circuit diagram of a single-ended-type level shifter according to a second embodiment of the present invention.

In some embodiments, the first load circuit 402 is implemented with a MOSFET transistor. FIG. 4D is a schematic circuit diagram of a single-ended-type level shifter according to a second embodiment of the present invention. In comparison with the level shifter 400 of the first embodiment, the component of the first load circuit 402 in the level shifter 420 of the second embodiment is distinguished. In this embodiment, the first load circuit 402 in the level shifter 420 comprises the MOSFET transistor MP1. For brevity, only the connecting relationship between the first load circuit 402 and associated components will be described as follows.

The first load circuit 402 comprises the MOSFET transistor MP1. The MOSFET transistor MP1 is a P-type transistor. In addition, the MOSFET transistor MP1 is a MV device. The source terminal of the MOSFET transistor MP1 receives the supply voltage $V_{DD2}$. The drain terminal of the MOSFET transistor MP1 is connected with the node c. The gate terminal of the MOSFET transistor MP1 receives the ground voltage GND. Consequently, the MOSFET transistor MP1 can be equivalent to a resistor.

The operations of the level shifter 420 shown in FIG. 4D are similar to those of the level shifter 400 shown in FIGS. 4B and 4C, and not redundantly described herein.

In some other embodiments, the first load circuit 402 comprises plural sub-load circuits. The sub-load circuits are connected between the supply voltage $V_{DD2}$ and the collector of the BJT transistor Q1. FIG. 4E is a schematic circuit diagram of a single-ended-type level shifter according to a third embodiment of the present invention. In comparison with the level shifter 400 of the first embodiment, the components of the first load circuit 402 in the level shifter 430 of the third embodiment are distinguished. In the third embodiment, the first load circuit 402 comprises x sub-load circuits 431~43*x*, where x is an integer greater than 1. For brevity, only the connecting relationship between the first load circuit 402 and associated components will be described as follows.

The first load circuit 402 comprises x sub-load circuits 431~43*x*. The x sub-load circuits 431~43*x* are composed of x MOSFET transistors MP1~MPx. These sub-load circuits are connected between the supply voltage $V_{DD2}$ and the node c. The gate terminals of the x MOSFET transistors MP1~MPx receive the ground voltage GND. The source terminal of the first MOSFET transistor MP1 is connected with the supply voltage $V_{DD2}$. The drain terminal of the x-th MOSFET transistor MPx is connected with the node c. The source terminal of each of the other MOSFET transistors is connected with the drain terminal of the previous MOSFET transistor. The drain terminal of each of the other MOSFET transistors is connected with the source terminal of the next MOSFET transistor. Consequently, each of the MOSFET transistors MP1~MPx is equivalent to a resistor.

The operations of the level shifter 430 shown in FIG. 4E are similar to those of the level shifter 400 shown in FIGS. 4B and 4C, and not redundantly described herein. In a variant example, the x sub-load circuits 431~43*x* are composed of x polysilicon resistors, which are serially connected between the supply voltage $V_{DD2}$ and the node c. The operations of the level shifter are similar to those of the level shifter 400 shown in FIGS. 4B and 4C, and not redundantly described herein.

Figure 4G:
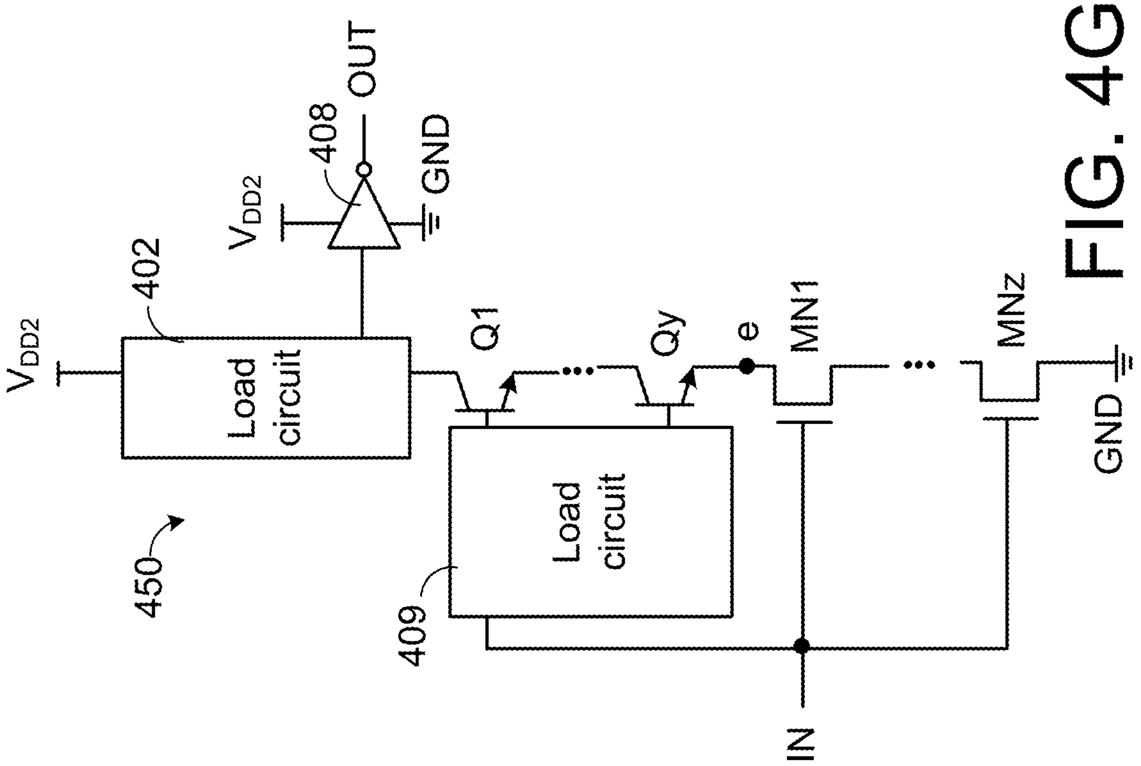
FIG. 4G is a schematic circuit diagram of a single-ended-type level shifter according to a fifth embodiment of the present invention.
Figure 4F:
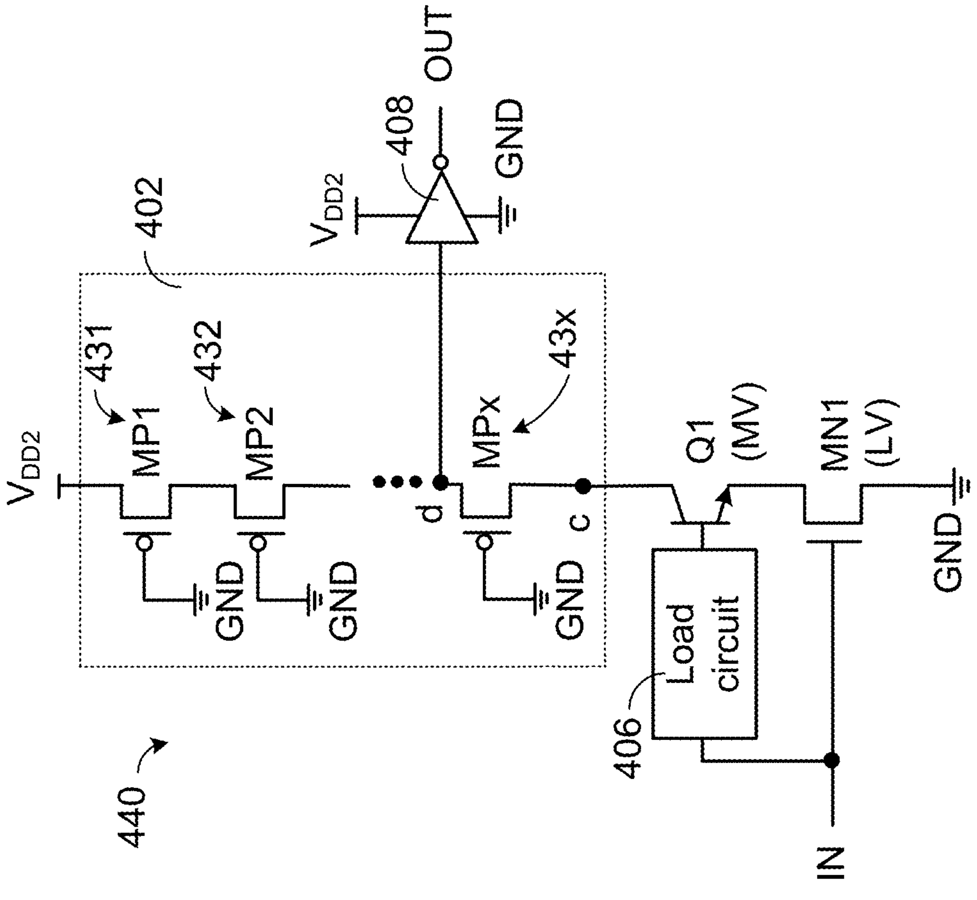
FIG. 4F is a schematic circuit diagram of a single-ended-type level shifter according to a fourth embodiment of the present invention.

The level shifter 430 of the third embodiment may be further modified as a fourth embodiment. FIG. 4F is a schematic circuit diagram of a single-ended-type level shifter according to a fourth embodiment of the present invention. In comparison with the level shifter 430 of the third embodiment, the input terminal of the NOT gate 408 in the level shifter 440 is connected with the node d. The node d is one node in the first load circuit 402 and arranged between the supply voltage $V_{DD2}$ and the node c. In FIG. 4F, the source terminal of the x-th MOSFET transistor is connected with the node d. It is noted that numerous modifications and alterations may be made while retaining the teachings of the invention. For example, in a variant example, the input terminal of the NOT gate 408 is connected with any node in the first load circuit 402 and between the supply voltage $V_{DD2}$ and the node c.

The operations of the level shifter 440 shown in FIG. 4F are similar to those of the level shifter 400 shown in FIGS. 4B and 4C, and not redundantly described herein. Similarly, in case that the x sub-load circuits 431~43*x* are composed of x polysilicon resistors, the input terminal of the NOT gate 408 is connected with any node in the first load circuit 402 and between the supply voltage $V_{DD2}$ and the node c.

In the above embodiments, the level shifter comprises a single BJT transistors and a single MOSFET transistor. In some other embodiments, the level shifter comprises plural BJT transistors and plural MOSFET transistors. FIG. 4G is a schematic circuit diagram of a single-ended-type level shifter according to a fifth embodiment of the present invention. In comparison with the level shifter 400 of the first embodiment, the level shifter 450 of the fifth embodiment comprises y BJT transistors Q1~Qy and z MOSFET transistors MN1~MNz. For brevity, only the connecting relationship between the y BJT transistors Q1~Qy and the z MOSFET transistors MN1~MNz and associated components will be described as follows.

The y BJT transistors Q1~Qy are connected between the second terminal of the first load circuit 402 and the node e in a cascode manner. The z MOSFET transistors MN1~MNz are connected between the node e and the ground voltage (GND) in a cascode manner. In addition, y and z are both integers greater than or equal to 1. If y and z are both equal to 1, the level shifter 450 of the fifth embodiment is identical to the level shifter 400 of the first embodiment. If y and z are not both 1, the level shifter 450 of the fifth embodiment is different from the level shifter 400 of the first embodiment.

The second load circuit 409 receives the input signal IN. The bases of the y BJT transistors Q1~Qy are connected with the second load circuit 409. The collector of the first BJT transistor Q1 is connected with the second terminal of the first load circuit 402. The emitter of the y-th BJT transistor Qy is connected with the node e. The collector of each of the other BJT transistors is connected with the emitter of the previous BJT transistor. The emitter of each of the other BJT transistors is connected with the next BJT transistor.

The gate terminals of the z MOSFET transistors MN1~MNz receive the input signal IN. The drain terminal of the first MOSFET transistor MN1 is connected with the node e. The source terminal of the z-th MOSFET transistor MNz is connected with the ground voltage GND. The drain terminal of each of the other MOSFET transistors are connected with the source terminal of the previous MOSFET transistor. The source terminal of each of the other MOSFET transistors is connected with the drain terminal of the next MOSFET transistor.

The operations of the level shifter 450 shown in FIG. 4G are similar to those of the level shifter 400 shown in FIGS. 4B and 4C, and not redundantly described herein. The second load circuit 409 in the level shifter 450 of the fifth embodiment may be implemented with one or plural resistors. For example, the resistor is a polysilicon resistor. In case that the magnitude of the base current is not taken into the consideration, the second load circuit 409 may be omitted. If the resistance value of the resistor in the second load circuit 409 is equal to zero, it means that the bases of the y BJT transistors Q1~Qy directly receive the input signal IN.

Figure 4I:
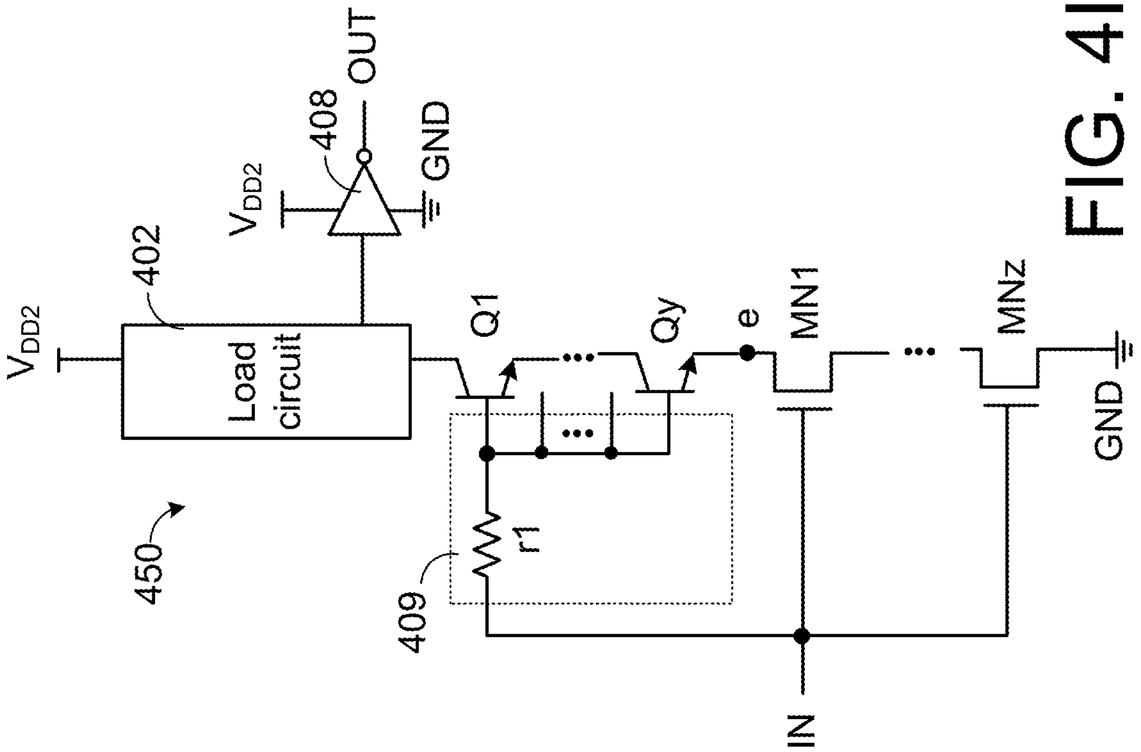
FIG. 4I is a schematic circuit diagram illustrating a second example of the second load circuit in the level shifter of the fifth embodiment.
Figure 4H:
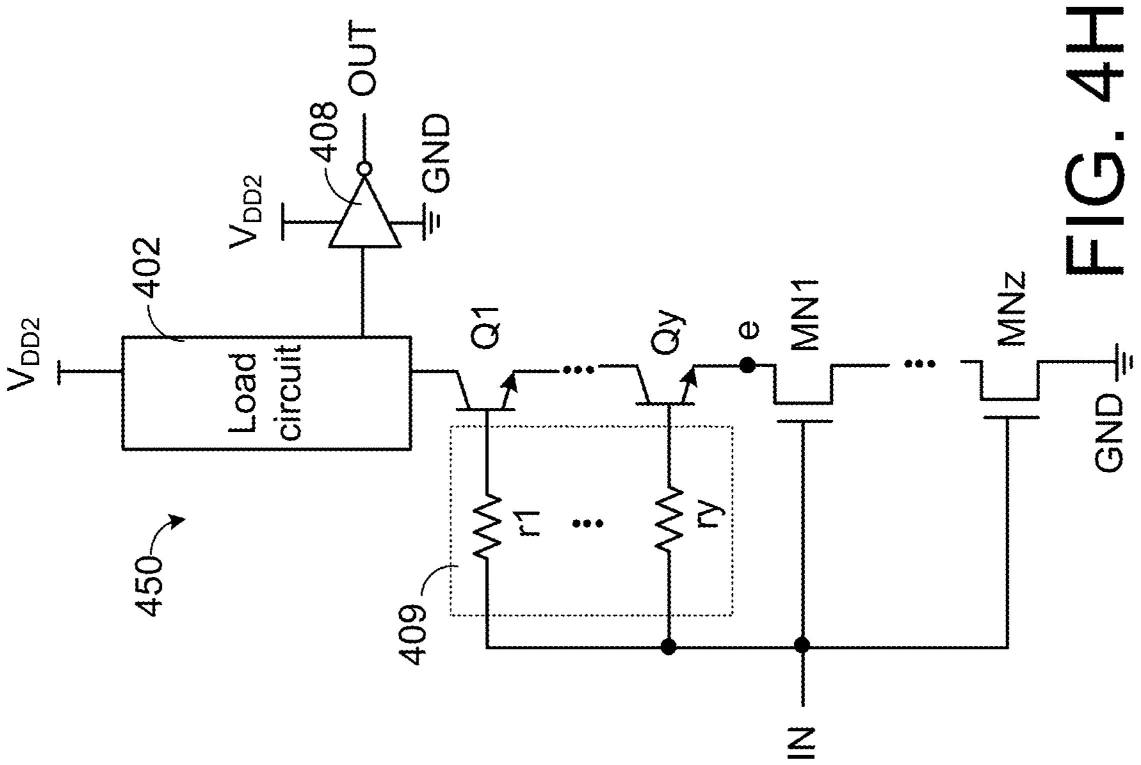
FIG. 4H is a schematic circuit diagram illustrating a first example of the second load circuit in the level shifter of the fifth embodiment.

FIG. 4H is a schematic circuit diagram illustrating a first example of the second load circuit in the level shifter of the fifth embodiment. FIG. 4I is a schematic circuit diagram illustrating a second example of the second load circuit in the level shifter of the fifth embodiment.

As shown in FIG. 4H, the second load circuit 409 comprises y resistors r1~ry. The first terminals of the y resistors r1~ry receive the input signal IN. The second terminals of the y resistors r1~ry are respectively connected with the bases of the y BJT transistors Q1~Qy.

As shown in FIG. 4I, the second load circuit 409 comprises a resistor r1. The first terminal of the resistor r1 receives the input signal IN. The second terminal of the resistor r1 is connected with the bases of the y BJT transistors Q1~Qy.

Figure 5A:
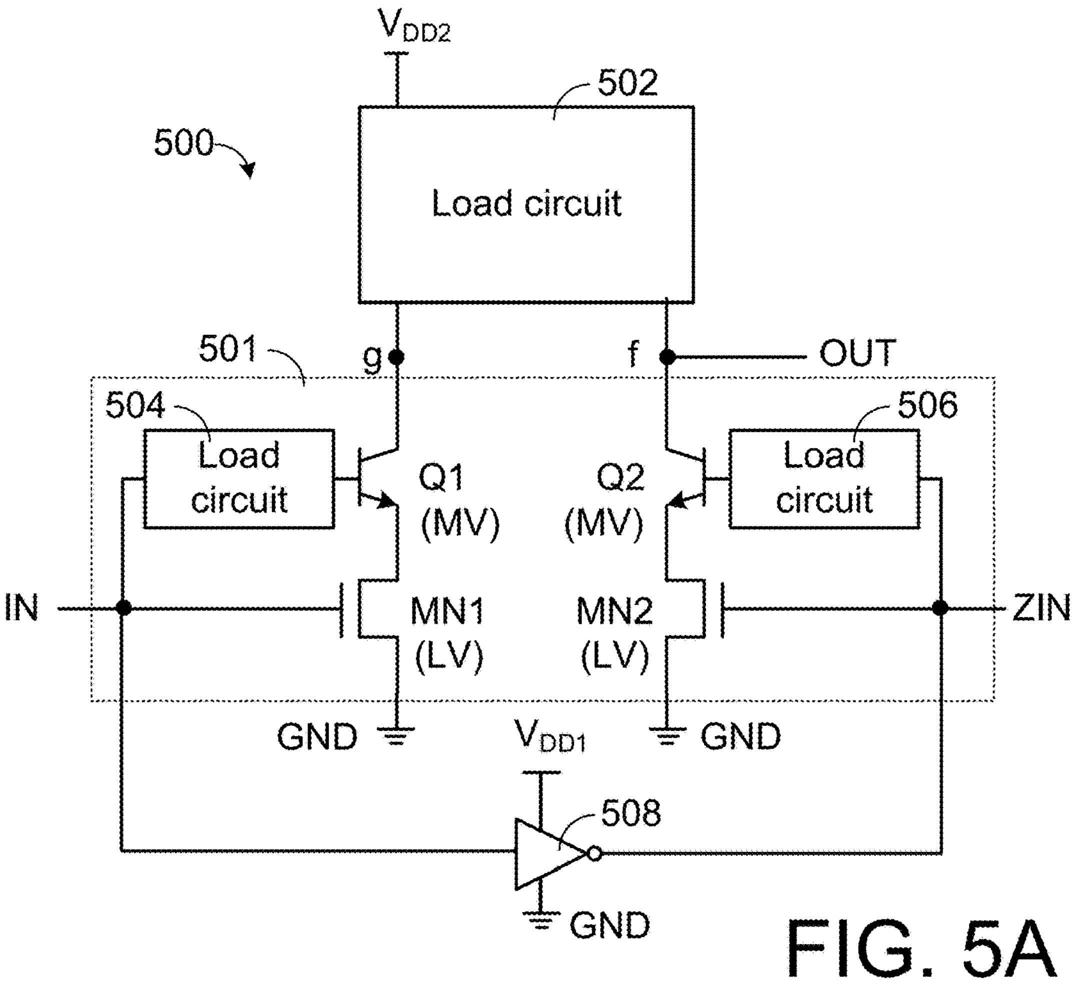
FIG. 5A is a schematic circuit diagram of a differential-type level shifter according to a first embodiment of the present invention.

FIG. 5A is a schematic circuit diagram of a differential-type level shifter according to a first embodiment of the present invention. As shown in FIG. 5A, the level shifter 500 comprises a NOT gate 508, a first load circuit 502 and a differential pair circuit 501. The differential pair circuit 501 comprises two BJT transistors Q1 and Q2, two MOSFET transistors MN1 and MN2, and two load circuits 504 and 506. The BJT transistors Q1 and Q2 are NPN transistors. In addition, the BJT transistors Q1 and Q2 are MV devices. The MOSFET transistors MN1 and MN2 are N-type transistors. In addition, the MOSFET transistors MN1 and MN2 are LV devices.

The two power terminals of the NOT gate 508 are respectively connected with the supply voltage $V_{DD1}$ and the ground voltage GND. The input terminal of the NOT gate 508 receives an input signal IN. The output terminal of the NOT gate 508 generates an inverted input signal ZIN. The first load circuit 502 is connected with the supply voltage $V_{DD2}$, the node f and the node g. In addition, the voltage at the node f is the output signal OUT.

In the differential pair circuit 501, the first terminal of the second load circuit 504 receives the input signal IN, the second terminal of the second load circuit 504 is connected with the base of the BJT transistor Q1, the collector of the BJT transistor Q1 is connected with the node g, the emitter of the BJT transistor Q1 is connected with the drain terminal of the MOSFET transistor MN1, the source terminal of the MOSFET transistor MN1 is connected with ground. Voltage GND, and the gate terminal of the MOSFET transistor MN1 receives the input signal IN.

In the differential pair circuit 501, the first terminal of the third load circuit 506 receives the inverted input signal ZIN, the second terminal of the third load circuit 506 is connected with the base of the BJT transistor Q2, the collector of the BJT transistor Q2 is connected with the node f, the emitter of the BJT transistor Q2 is connected with the drain terminal of the MOSFET transistor MN2, the source terminal of the MOSFET transistor MN2 is connected with the ground voltage GND, and the gate terminal of the MOSFET transistor MN2 receives the inverted input signal ZIN.

Since the MOSFET transistors MN1 and MN2 are LV devices, each of their threshold voltages Vt is very low. In addition, the turn on voltage of each of the BJT transistors Q1 and Q2 is about 0.7V. That is, in response to the logic high level of the supply voltage $V_{DD1}$, the MOSFET transistor MN1 and the BJT transistor Q1 can be turned on easily. For example, the supply voltage $V_{DD1}$ is 1.2V, and the supply voltage $V_{DD2}$ is 5V.

Figure 5B:
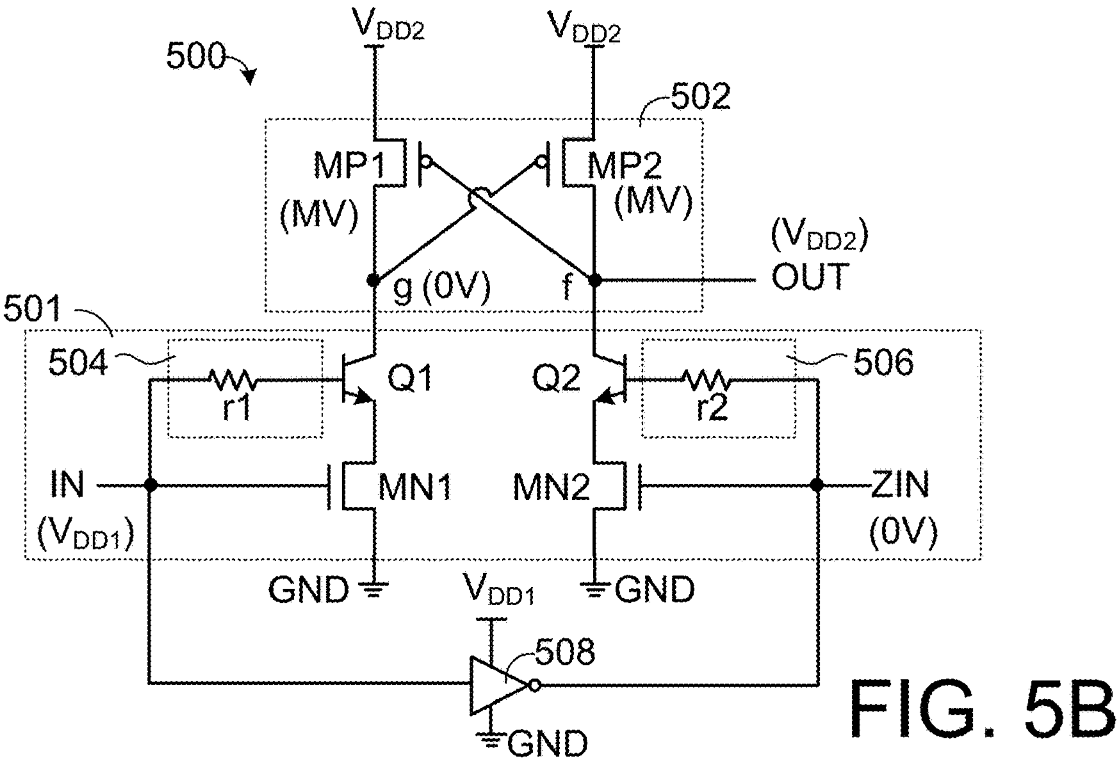
FIGS. 5B and 5C is a schematic circuit diagram illustrating the operations of the differential-type level shifter shown in FIG. 5A.
Figure 5C:
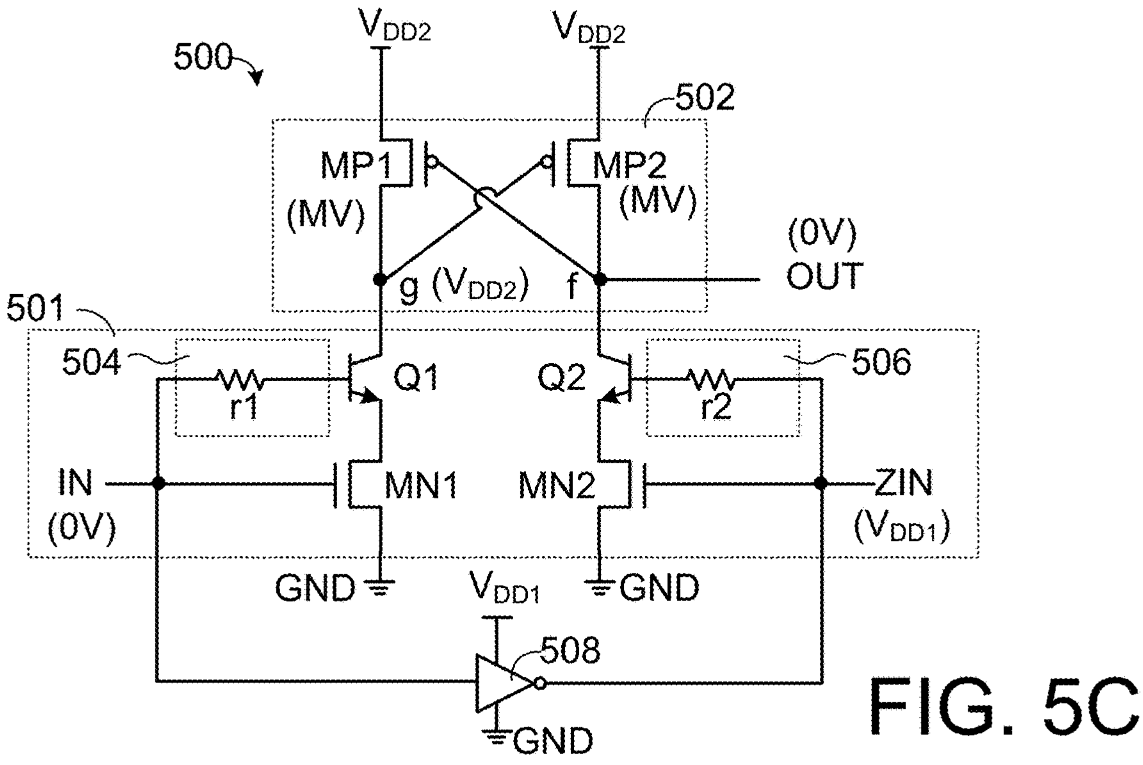

In an embodiment, the load circuits 504 and 506 are resistors (e.g., polysilicon resistors), and the first load circuit 502 comprises MOSFET transistors. Hereinafter, the operations of the level shifter 500 will be illustrated with reference to FIGS. 5B and 5C. FIGS. 5B and 5C is a schematic circuit diagram illustrating the operations of the differential-type level shifter shown in FIG. 5A. The second load circuit 504 comprises a resistor r1. The third load circuit 506 comprises a resistor r2. In the second load circuit 504, the first terminal of the resistor r1 receives the input signal IN, and the second terminal of the resistor r1 is connected with the base of the BJT transistor Q1. In the third load circuit 506, the first terminal of the resistor r2 receives the inverted input signal ZIN, and the second terminal of the resistor r2 is connected with the base of the BJT transistor Q2.

The first load circuit 502 comprises two MOSFET transistors MP1 and MP2. The two MOSFET transistors MP1 and MP2 are P-type transistors. In addition, the two MOSFET transistors MP1 and MP2 are MV devices. The source terminal of the MOSFET transistor MP1 is connected with the supply voltage $V_{DD2}$. The drain terminal of the MOSFET transistor MP1 is connected with the node g. The gate terminal of the MOSFET transistor MP1 is connected with the node f. The source terminal of the MOSFET transistor MP2 is connected with the supply voltage $V_{DD2}$. The drain terminal of the MOSFET transistor MP2 is connected with the node f. The gate terminal of the MOSFET transistor MP2 is connected with the node g.

Please refer to FIG. 5B. In case that the input signal IN of the level shifter 500 is the supply voltage $V_{DD1}$ (i.e., the logic high level) and the inverted input signal ZIN is the ground voltage GND (i.e., the logic low level), the MOSFET transistors MN1 and MP2 and the BJT transistor Q1 are turned on, and the MOSFET transistors MN2 and MP1 and the BJT transistor Q2 are turned off. Consequently, the voltage at the node g is the ground voltage GND, and the voltage at the node f is the supply voltage $V_{DD2}$. The output signal OUT from the level shifter 500 is the supply voltage $V_{DD2}$ (i.e., the logic high level). In other words, the supply voltage $V_{DD1}$ with the logic high level is converted into the supply voltage $V_{DD2}$ with another logic high level by the level shifter 500.

Please refer to FIG. 5C. In case that the input signal IN of the level shifter 500 is the ground voltage GND (i.e., the logic low level) and the inverted input signal ZIN is the supply voltage $V_{DD1}$ (i.e., the logic high level), the MOSFET transistors MN1 and MP2 and the BJT transistor Q1 are turned off, and the MOSFET transistors MN2 and MP1 and the BJT transistor Q2 are turned on. Consequently, the voltage at the node g is the supply voltage $V_{DD2}$, and the voltage at the node f is the ground voltage GND. Consequently, the output signal OUT from the level shifter 500 is the ground voltage GND (i.e., the logic low level). In other words, the ground voltage GND with the logic low level is converted into the ground voltage GND with another logic low level by the level shifter 500.

In the level shifter 500 of the first embodiment, the load circuits 504 and 506 are implemented with polysilicon resistors. The resistance value of the resistor r1 in the second load circuit 504 is related to the base current of the BJT transistor Q1, and the resistance value of the resistor r2 in the third load circuit 506 is related to the base current of the BJT transistor Q2. Consequently, in case that the magnitude of the base current is not taken into the consideration, the load circuits 504 and 506 can be omitted. In other words, the resistance value of the resistor r1 in the second load circuit 504 needs to be greater than or equal to zero, and the resistance value of the resistor r2 in the third load circuit 506 needs to be greater than or equal to zero. If the resistance value of the resistor r1 and the resistance value of the resistor r2 are equal to zero, it means that the base of the BJT transistor Q1 directly receives the input signal IN and the base of the BJT transistor Q2 directly receives the inverted input signal ZIN.

Figure 5D:
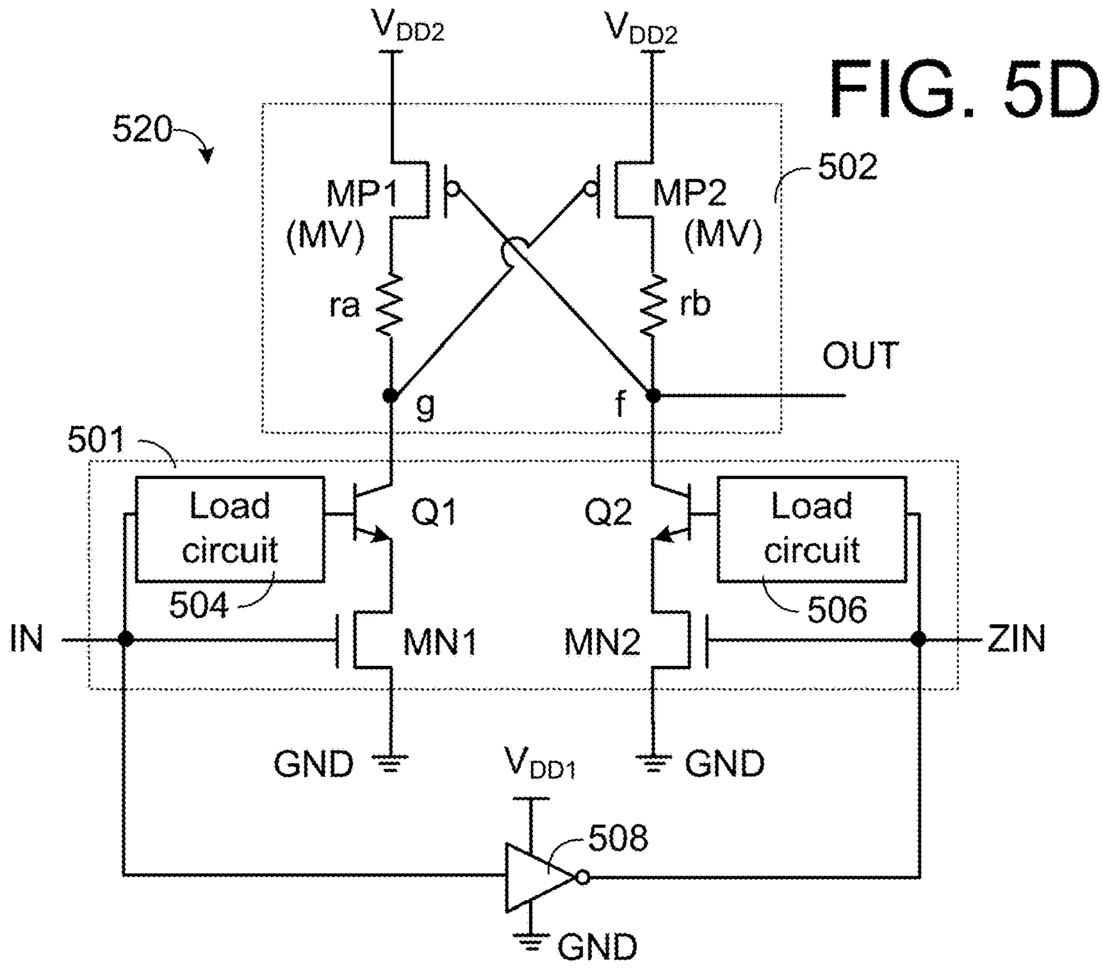
FIG. 5D is a schematic circuit diagram of a differential-type level shifter according to a second embodiment of the present invention.

In some embodiments, the first load circuit 502 is implemented with MOSFET transistors and resistors. FIG. 5D is a schematic circuit diagram of a differential-type level shifter according to a second embodiment of the present invention. In comparison with the level shifter 500 of the first embodiment, the components of the first load circuit 502 in the level shifter 520 of the second embodiment are distinguished. In this embodiment, the first load circuit 502 in the level shifter 520 comprises two MOSFET transistors MP1 and MP2 and two resistors ra and rb. For brevity, only the connecting relationship between the first load circuit 502 and associated components will be described as follows.

In the first load circuit 502, the MOSFET transistors MP1 and MP2 are P-type transistors. In addition, the MOSFET transistors MP1 and MP2 are MV devices. The source terminal of the MOSFET transistor MP1 receives the supply voltage $V_{DD2}$. The drain terminal of the MOSFET transistor MP1 is connected with the first terminal of the resistor ra. The second terminal of the resistor ra is connected with the node g. The gate terminal of the MOSFET transistor MP1 is connected with the node f. The source terminal of the MOSFET transistor MP2 receives the supply voltage $V_{DD2}$. The drain terminal of the MOSFET transistor MP2 is connected with the first terminal of the resistor rb. The second terminal of the resistor rb is connected with the node f. The gate terminal of the MOSFET transistor MP2 is connected with the node g.

The operations of the level shifter 520 shown in FIG. 5D are similar to those of the level shifter 520 shown in FIGS. 5B and 5C, and not redundantly described herein.

Figure 5E:
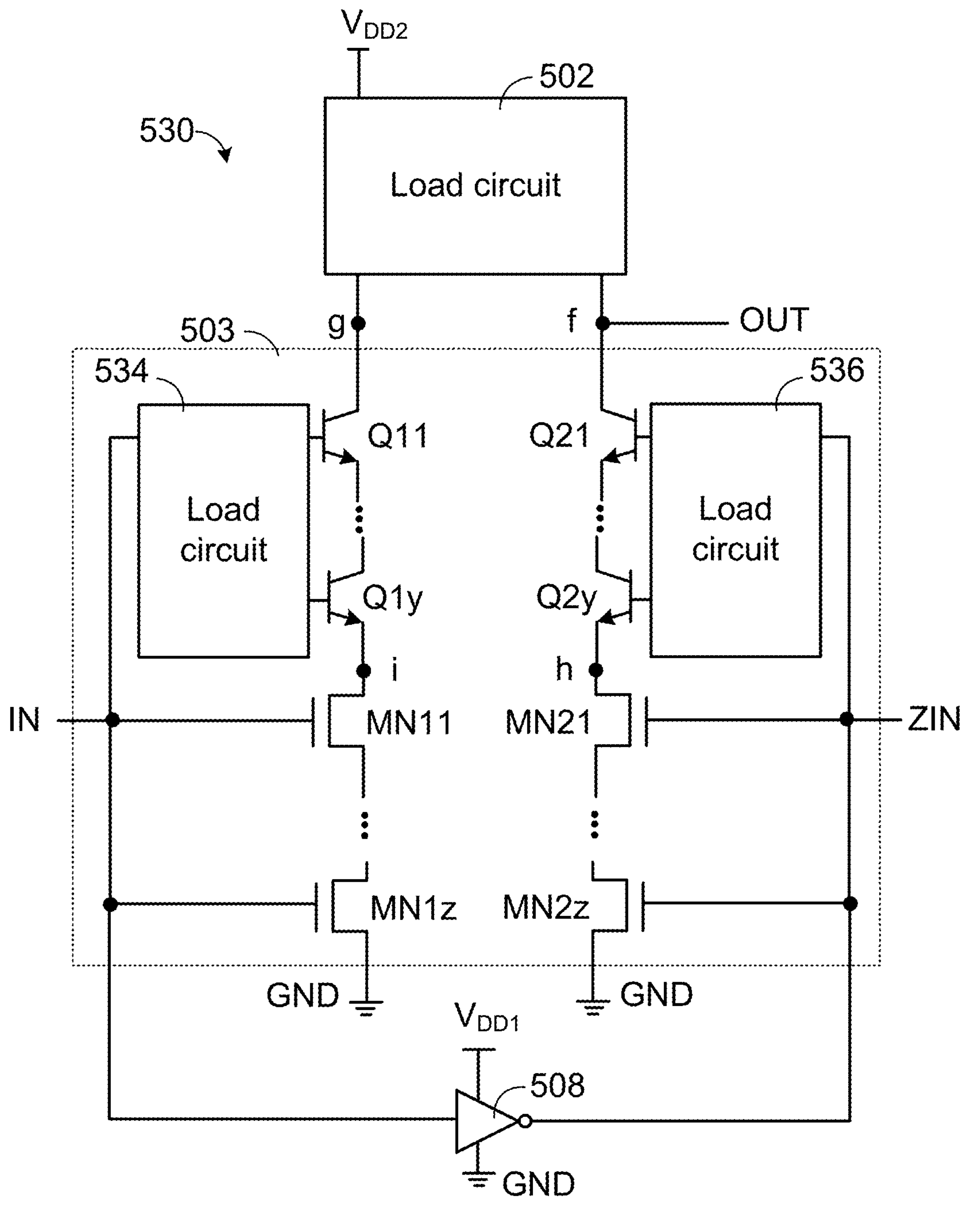
FIG. 5E is a schematic circuit diagram of a differential-type level shifter according to a third embodiment of the present invention.

FIG. 5E is a schematic circuit diagram of a differential-type level shifter according to a third embodiment of the present invention. In comparison with the level shifter 500 of the first embodiment, the components of the differential pair circuit 503 in the level shifter 530 of the third embodiment are distinguished. In this embodiment, the differential pair circuit 503 in the level shifter 530 comprises two load circuits 534 and 536, 2*y* BJT transistors Q11~Q1*y*, Q21~Q2*y*, and 2*z* MOSFET transistors MN11~MN1*z*, MN21~MN2*z*. For brevity, only the connecting relationship between the differential pair circuit 503 and associated components will be described as follows.

In the differential pair circuit 503, the first group of y BJT transistors Q11~Q1*y* are connected between the node g and the node i in a cascode manner, the second group of y BJT transistors Q21~Q2*y* are connected between the node f and the node h in a cascode manner, the third group of z MOSFET transistors MN11~MN1*z* are connected between the node i and the ground voltage (GND) in a cascode manner, and the fourth group of z MOSFET transistors MN21~MN2*z* are connected between the node h and the ground voltage GND in a cascode manner. In addition, y and z are both integers greater than or equal to 1. If y and z are both equal to 1, the level shifter 530 of the third embodiment is identical to the level shifter 500 of the first embodiment. If y and z are not both 1, the level shifter 530 of the third embodiment is different from the level shifter 500 of the first embodiment.

The second load circuit 534 receives the input signal IN. The bases of the first group of y BJT transistors Q11~Q1*y* are connected with the second load circuit 534. In the first group of y BJT transistors Q11~Q1*y*, the collector of the first BJT transistor Q11 is connected with the node g, the emitter of the y-th BJT transistor Q1*y* is connected with the node i, the collector of each of the other BJT transistors is connected with the emitter of the previous BJT transistor, and the emitter of each of the other BJT transistors is connected with the next BJT transistor.

The gate terminals of the third group of z MOSFET transistors MN11~MN1*z* receive the input signal IN. In the third group of z MOSFET transistors MN11~MN1*z*, the drain terminal of the first MOSFET transistor MN11 is connected with the node i, the source terminal of the z-th MOSFET transistor MN1*z* is connected with the ground voltage GND, the drain terminal of each of the other MOSFET transistors is connected with the source terminal of the previous MOSFET transistor, and the source terminal of the other MOSFET transistors is connected with the drain terminal of the next MOSFET transistor.

The third load circuit 536 receives the inverted input signal ZIN. The bases of the second group of y BJT transistors Q21~Q2*y* are connected with the third load circuit 536. In the second group of y BJT transistors Q21~Q2*y*, the collector of the first BJT transistor Q21 is connected with the node f, the emitter of the y-th BJT transistor Q2*y* is connected with the node h, the collector of each of the other BJT transistors is connected with the emitter of the previous BJT transistor, and the emitter of each of the other BJT transistors is connected with the next BJT transistor.

The gate terminals of the fourth group of z MOSFET transistors MN21~MN2*z* receive the inverted input signal ZIN. In the fourth group of z MOSFET transistors MN21~MN2*z*, the drain terminal of the first MOSFET transistor MN21 is connected with the node h, the source terminal of the z-th MOSFET transistor MN2*z* is connected with the ground voltage GND, the drain terminal of each of the other MOSFET transistors is connected with the source terminal of the previous MOSFET transistor, and the source terminal of the other MOSFET transistors is connected with the drain terminal of the next MOSFET transistor.

The operations of the level shifter 530 shown in FIG. 5E are similar to those of the level shifter 500 shown in FIGS. 5B and 5C, and not redundantly described herein. Each of the load circuits 534 and 536 in the level shifter 530 of the third embodiment may be implemented with plural resistors, e.g., polysilicon resistors. In case that the magnitude of the base current is not taken into the consideration, the load circuits 534 and 536 may be omitted. In other words, the resistance value of each resistor in the load circuits 534 and 536 needs to be greater than or equal to zero. If the resistance value of each resistor in the load circuits 534 and 536 is equal to zero, it means that the bases of the first group of y BJT transistors Q11~Q1*y* directly receive the input signal IN and the bases of the second group of y BJT transistors Q21~Q2*y* directly receive the inverted input signal ZIN.

Figure 5G:
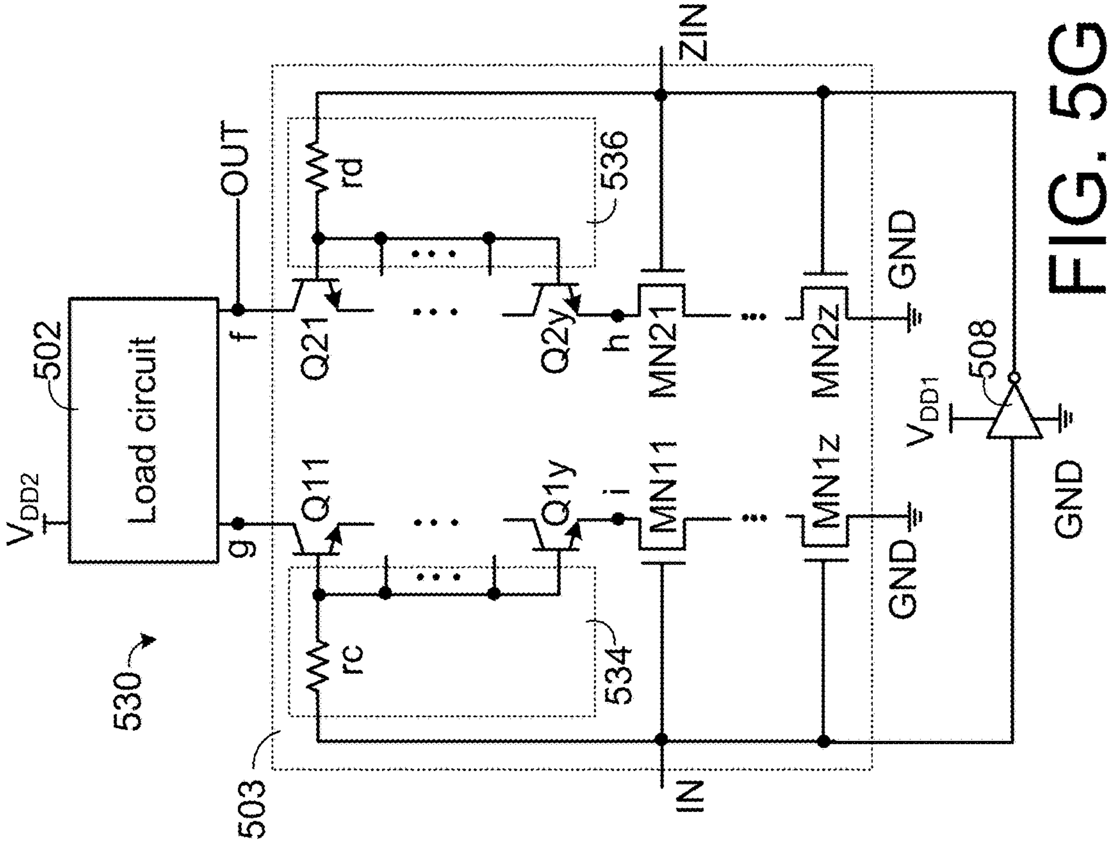
FIG. 5G is a schematic circuit diagram illustrating a second example of the second load circuit and the third load circuit in the level shifter of the third embodiment.

The load circuits 534 and 536 in the level shifter 530 of the third embodiment have two exemplary circuitry structures. 5F is a schematic circuit diagram illustrating a first example of the second load circuit and the third load circuit in the level shifter of the third embodiment. FIG. 5G is a schematic circuit diagram illustrating a second example of the second load circuit and the third load circuit in the level shifter of the third embodiment.

Figure 5F:
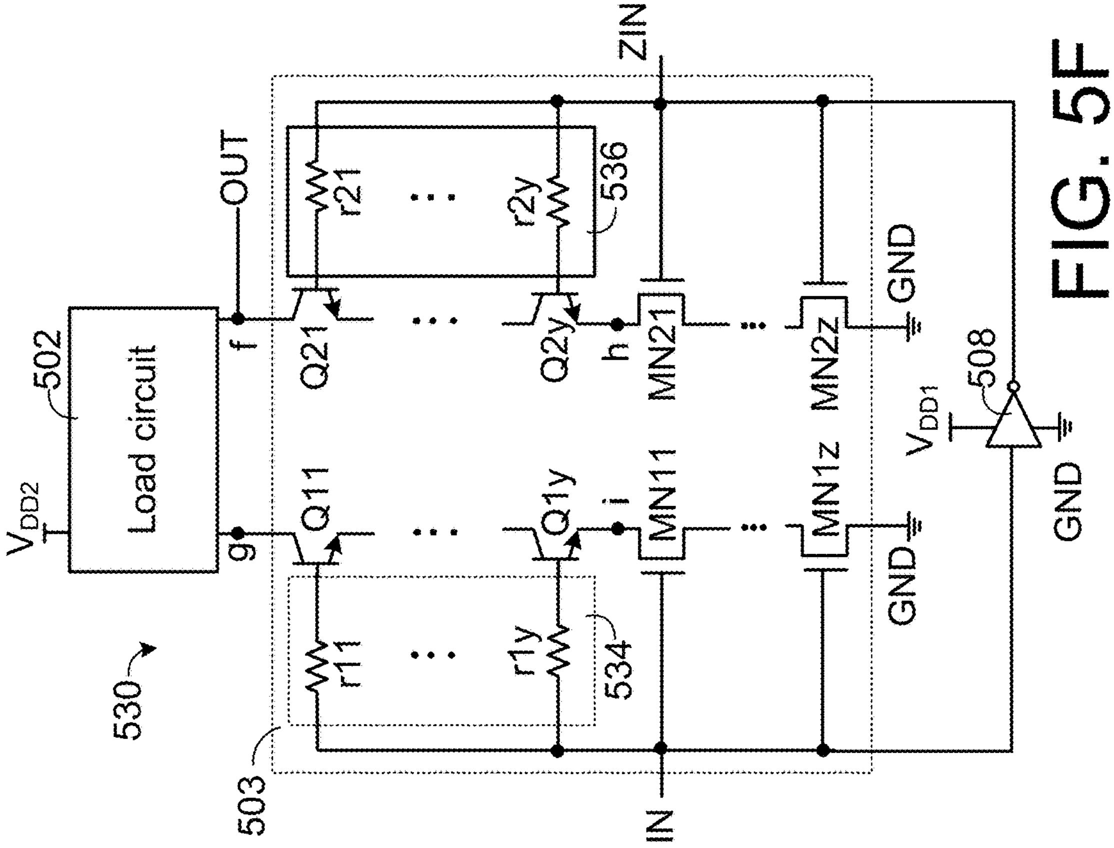
FIG. 5F is a schematic circuit diagram illustrating a first example of the second load circuit and the third load circuit in the level shifter of the third embodiment.

As shown in FIG. 5F, the second load circuit 534 comprises y resistors r11~r1*y*. The first terminals of the y resistors r1~ry receive the input signal IN. The second terminals of the y resistors r1~ry are respectively connected with the bases of the y BJT transistors Q11~Q1*y*. The third load circuit 536 comprises y resistors r21~r2*y*. The first terminals of the y resistors r21~r2*y* receive the inverted input signal ZIN. The second terminals of the y resistors r21~r2*y* are respectively connected with the bases of the y BJT transistors Q21~Q2*y*.

As shown in FIG. 5G, the second load circuit 534 comprises a resistor rc. The first terminal of the resistor rc receives the input signal IN. T second terminal of the resistor rc is connected with the bases of y BJT transistors Q11~Q1*y*. The third load circuit 536 comprises a resistor rd. The first terminal of the resistor rd receives the inverted input signal ZIN. The second terminal of the resistor rd is connected with the bases of y BJT transistors Q21~Q2*y*.

From the above descriptions, the present invention provides a level shifter. The level shifter is a single-ended-type level shifter or a differential-type level shifter. The manufacturing process of the level shifter is compatible with the existing CMOS manufacturing process and does not require the use of an additional special manufacturing process. Furthermore, the level shifter can be operated normally without the need of receiving the bias voltage.

It should be noted that the function of the load circuits in the above embodiments is to suppress the base current of the BJT in the level shifter circuit, in order to save unnecessary power consumption. Moreover, the function of the load circuits in the above embodiments is to limit the collector current of the BJT in the level shifter circuit, in order to avoid unnecessary latch-up issues.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter for converting an input signal between a first supply voltage and a ground voltage into an output signal between a second supply voltage and the ground voltage, the level shifter comprising:

a first load circuit, wherein a first terminal of the first load circuit receives the second supply voltage;

a second load circuit, wherein a first terminal of the second load circuit receives the input signal;

a BJT transistor, wherein a collector of the BJT transistor is connected with a second terminal of the first load circuit, and a base of the BJT transistor is connected with a second terminal of the second load circuit;

a first MOSFET transistor, wherein a drain terminal of the first MOSFET transistor is connected with an emitter of the BJT transistor, a source terminal of the first MOSFET transistor receives the ground voltage, and a gate terminal of the first MOSFET transistor receives the input signal; and a NOT gate, wherein a first power terminal of the NOT gate receives the second supply voltage, a second power terminal of the NOT gate receives the ground voltage, an input terminal of the NOT gate is connected with the first load circuit, and an output terminal of the NOT gate generates the output signal.

2. The level shifter as claimed in claim 1, wherein the first load circuit comprises a first resistor, wherein a first terminal of the first resistor receives the second supply voltage, a second terminal of the first resistor is connected with a first node, the collector of the BJT transistor is connected with the first node, and the input terminal of the NOT gate is connected with the first node.

3. The level shifter as claimed in claim 1, wherein the first load circuit comprises a second MOSFET transistor, wherein a source terminal of the second MOSFET transistor receives the second supply voltage, a drain terminal of the second MOSFET transistor is connected with a first node, a gate terminal of the first MOSFET transistor receives the ground voltage, the collector of the BJT transistor is connected with the first node, and the input terminal of the NOT gate is connected with first node.

4. The level shifter as claimed in claim 1, wherein the first load circuit comprises x sub-load circuits, wherein the x sub-load circuits are connected between the second supply voltage and a first node, the collector of the BJT transistor is connected with the first node, the input terminal of the NOT gate is connected with the first node, and x is an integer greater than 1.

5. The level shifter as claimed in claim 4, wherein the x sub-load circuits are composed of x resistors, and the x resistors are connected between the second supply voltage and the first node in series.

6. The level shifter as claimed in claim 4, wherein the x sub-load circuits are composed of x MOSFET transistors, and the x MOSFET transistors are P-type transistors, and gate terminals of the x P-type transistors receive the ground voltage, wherein in the x P-type transistors, a source terminal of a first P-type transistor receives the second supply voltage, a drain terminal of an x-th P-type transistor is connected with the first node, a source terminal of each of the other P-type transistors is connected with a drain terminal of a previous P-type transistor, and a drain terminal of each of the other P-type transistors is connected with a source terminal of a next P-type transistor.

7. The level shifter as claimed in claim 1, wherein the first load circuit comprises x sub-load circuits, wherein the x sub-load circuits are connected between the second supply voltage and a first node, the collector of the BJT transistor is connected with the first node, the input terminal of the NOT gate is connected with a second node between the second supply voltage and the first node, and x is an integer greater than 1.

8. The level shifter as claimed in claim 1, wherein the second load circuit comprises a second resistor, wherein a first terminal of the second resistor receives the input signal, and a second terminal of the second resistor is connected with the base of the BJT transistor.

9. The level shifter as claimed in claim 8, wherein a resistance value of the second resistor is greater than or equal to zero.

10. A level shifter for converting an input signal between a first supply voltage and a ground voltage into an output signal between a second supply voltage and the ground voltage, the level shifter comprising:

a first load circuit, wherein a first terminal of the first load circuit receives the second supply voltage;

a second load circuit, wherein a first terminal of the second load circuit receives the input signal;

y BJT transistors, wherein bases of the y BJT transistors are connected with the second load circuit, and y is an integer greater than or equal to 1, wherein in the y BJT transistors, a collector of a first BJT transistor is connected with a second terminal of the first load circuit, an emitter of a y-th BJT transistor is connected with a first node, a collector of each of the other BJT transistors is connected with an emitter of a previous BJT transistor, and an emitter of each of the other BJT transistors is connected with a collector of a next BJT transistor;

z MOSFET transistors, wherein gate terminals of the z MOSFET transistors receive the input signal, z is an integer greater than or equal to 1, and if one of y and z is 1, the other of y and z is not 1, wherein in the z MOSFET transistors, a drain terminal of a first MOSFET transistor is connected with the first node, a source terminal of a z-th MOSFET transistor receives the ground voltage, a drain terminal of each of the other MOSFET transistors is connected with a source terminal of a previous MOSFET transistor, and a source terminal of each of the other MOSFET transistor is connected with a drain terminal of a next MOSFET transistor; and a NOT gate, wherein a first power terminal of the NOT gate receives the second supply voltage, a second power terminal of the NOT gate receives the ground voltage, an input terminal of the NOT gate is connected with the first load circuit, and an output terminal of the NOT gate generates the output signal.

11. The level shifter as claimed in claim 10, wherein the second load circuit comprises y resistors, wherein first terminals of the y resistors receive the input signal, and second terminals of the y resistors are respectively connected with the bases of the y BJT transistors.

12. The level shifter as claimed in claim 10, wherein the second load circuit comprises a resistor, wherein a first terminal of the resistor receives the input signal, and a second terminal of the resistor is connected with the bases of the y BJT transistors.

13. The level shifter as claimed in claim 12, wherein a resistance value of the resistor is greater than or equal to zero.

* * * * *